(12) United States Patent
Nakaminami et al.

(10) Patent No.: US 6,806,936 B2
(45) Date of Patent: Oct. 19, 2004

(54) DISPLAY MODULE INCLUDING A DISPLAY PANEL CONNECTED TO A FLEXIBLE WIRE BOARD WITH AN INSULATING PROTECTIVE LAYER EXTENDED INSIDE THE DISPLAY PANEL

(75) Inventors: Hiroaki Nakaminami, Mie (JP); Yoichiro Sakaki, Tsu (JP); Hisao Kawaguchi, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 154 days.

(21) Appl. No.: 10/077,927

(22) Filed: Feb. 20, 2002

(65) Prior Publication Data
US 2002/0135727 A1 Sep. 26, 2002

(30) Foreign Application Priority Data
Mar. 26, 2001 (JP) ........................................ 2001-088655
Sep. 21, 2001 (JP) ........................................ 2001-289894

(51) Int. Cl.[7] ...................... G02F 1/1345; G02F 1/1343
(52) U.S. Cl. ........................ 349/149; 349/150; 349/152
(58) Field of Search ................................. 349/149–152; 345/55

(56) References Cited

U.S. PATENT DOCUMENTS

| | | | | | |
|---|---|---|---|---|---|
| 5,311,341 | A | * | 5/1994 | Hirai | 349/150 |
| 5,528,403 | A | * | 6/1996 | Kawaguchi et al. | 349/149 |
| 6,172,730 | B1 | * | 1/2001 | Fujita | 349/149 |
| 6,211,936 | B1 | * | 4/2001 | Nakamura | 349/152 |
| 6,437,846 | B1 | * | 8/2002 | Ono et al. | 349/149 |

FOREIGN PATENT DOCUMENTS

JP 9-138387 5/1997

* cited by examiner

Primary Examiner—Tarifur R. Chowdhury
(74) Attorney, Agent, or Firm—Birch, Stewart, Kolasch & Birch, LLP.

(57) ABSTRACT

A display module, in which panel electrode terminals of a display panel are bonded to pattern terminals of a Cu foil pattern of a flexible wire board by using an anisotropic conductive adhesive, has a solder resist for protecting the Cu foil pattern on a base material of the flexible wire board so that the solder resist is extended inside the display panel while having the flexible wire board connected to the display panel. Therefore, even when the flexible wire board is used in a bent state, poor connection is surely prevented while conveniently suppressing a break in wire of the Cu foil pattern when bent, thereby attaining a highly reliable display module.

15 Claims, 12 Drawing Sheets

DISPLAY MODULE INCLUDING A DISPLAY PANEL CONNECTED TO A FLEXIBLE WIRE BOARD WITH AN INSULATING PROTECTIVE LAYER EXTENDED INSIDE THE DISPLAY PANEL

FIELD OF THE INVENTION

The present invention relates to a display module, a flexible wire board and a flexible wire board connecting method, which have an arrangement in which an anisotropic conductive adhesive is used to bond external connection terminals of a display panel, such as a liquid crystal display panel, to a terminal portion of a wire pattern of the flexible wire board, and a protective layer for protecting the wire pattern is formed on the flexible wire board.

BACKGROUND OF THE INVENTION

Conventionally used for connection between various electronic members, and particularly a connection between a liquid crystal display panel and its driving circuit is a flexible wire board having an arrangement in which a wire pattern is formed on a flexible insulating base material which is made of polymer, such as polyimide or the like.

On the flexible wire board is mounted a semiconductor device, thereby making up a semiconductor apparatus. The semiconductor device thus mounted becomes a driving circuit of a liquid crystal display panel. An example of a conventional semiconductor device connecting method is TCP (Tape Carrier Package) mounting. A flexible wire board on which a semiconductor device is mounted by the TCP mounting is, as shown in FIG. 10, arranged such that a Cu (copper) foil pattern 102 is bonded to a base polymer film 101 by a copper film adhesive layer 105. The base polymer film 101 is a flexible insulating base material made of polymer.

Further, the Cu foil pattern 102 is covered with a polymer insulating protective film 104. The insulating protective film 104 is bonded to the Cu foil pattern 102 by an insulating protective film adhesive layer 106, provided that one end of the Cu foil pattern 102 is left uncovered, i.e., not covered with the insulating protective film 104. The uncovered portion of the Cu foil pattern 102 functions as a terminal portion to connect to an external electronic member.

Here, the insulating protective film 104 insulates the Cu foil pattern 102 from the outside, protects the Cu foil pattern 102 from corrosion such as the formation of rust, and enhances resistance to bending.

On a surface of the uncovered portion of the Cu foil pattern 102 is formed a plating layer 103 which is given such plating as Au/Ni plating (i.e., an Ni layer is first formed as a base coat which is then plated with Au), Sn plating or the like. The plating layer 103 has a function to stabilize connection to an external electronic component by keeping the Cu foil pattern 102 rust free. Accordingly, the uncovered portion of the Cu foil pattern 102 becomes a terminal portion having superior conductivity.

Note that, though FIG. 10 shows an arrangement in which the base polymer film 101 and the Cu foil pattern 102 are bonded with an adhesive (copper film use adhesive layer 105), further available is an "adhesive-free" flexible wire board having an arrangement in which the base polymer film 101 and the copper foil pattern 102 are directly bonded.

Meanwhile, in accordance with a tendency in recent years to downsize outside dimensions of electronic devices of various kinds, such as a liquid crystal display device and the like, a form of mounting components which saves as larger space as possible is greatly demanded. In fulfillment of such demand, a flexible wire board as below is used in a bent state. The flexible wire board is connected to connection terminals of an electronic component, such as a liquid crystal display panel, etc., so as to supply the connection terminals with various signals including input signals from other electronic components such as a driving circuit and the like which are provided individually (i.e. so that they are segregated) from the electronic component having the connection terminals to which the flexible wire board is connected. By bending the flexible wire board, the flexible wire board can be placed in a position that does not obstruct the mounting of other electronic components. Moreover, thus bending the flexible wire board can downsize the whole device that includes a plurality of electronic components and the flexible wire board that connects them. Further, in accordance with a tendency in recent years to further downsize electronic devices of various kinds, such a flexible wire board that has as smaller radius of curvature as possible while maintaining high reliability is demanded.

In order to fulfil this demand, recently adopted as a connection method capable of mounting a semiconductor device onto the flexible wire board is COF (Chip On Film) mounting. The reason is that the COF (Chip On Film) mounting reduces a thickness of a base material of the flexible wire board more than TCP mounting does.

In the case of the TCP mounting, on one hand, a base material thickness of the base polymer film 101 which is a base material is 75 $\mu$m. On the other hand, in the case of the COF mounting, a base material thickness of the flexible wire board is as thin as 40 $\mu$m. The flexible wire board subject to the COF mounting has higher flexibility than that of the flexible wire board subject to the TCP mounting because of its thin base material, thereby being easily bent.

The flexible wire board subject to the COF mounting, however, has a problem such that a Cu foil pattern is likely to break when the flexible wire board is bent to be mounted onto a liquid crystal display panel.

More specifically, as shown in FIG. 11, in the case where a terminal portion (an uncovered portion of a Cu foil pattern 204) of a flexible wire board 203 subject to COF mounting is bent for connection to not-shown external connection terminals of a liquid crystal display panel 201, the absence of a solder resist 205 which is a protective layer in an end portion of the flexible wire board 203 allows a terminal corner 201a of the liquid crystal display panel 201 to contact terminals or a portion in the vicinity of the terminals where the Cu foil pattern 204 is exposed, thereby easily breaking wire in a portion where the contact is made.

In order to solve this problem, the uncovered portion of the Cu foil pattern 204 is conventionally fortified with resin coating or the like. However, the fortification like this inevitably increases manufacturing steps in the manufacture of the flexible wire board, thereby reducing manufacture efficiency and increasing manufacturing costs.

Further, Japanese Unexamined Patent Publication No. 138387/1997 (Tokukaihei 9-138387 published on May 27, 1997), for example, proposes a solution to the problem. Namely, an end portion of an insulating protective film to be a base material of a flexible wire board is caused to become wavy, then a bending portion of the flexible wire board is given a desirable R while maintaining a bent state, thereby dispersing stress which is added to the insulating protective film in the bending portion and suppressing emergence of a break in the wire pattern.

This arrangement, however, raises other problems. Namely, the formation of a wavy insulating protective film complicates the manufacture of the flexible wire board, which reduces manufacture efficiency and increases manufacturing costs, and also upsizes the flexible wire board by height of a wave of the wavy insulating protective film.

SUMMARY OF THE INVENTION

It is an object of the present invention to provide a display module, a flexible wire board and a flexible wire board connecting method, whereby, in a flexible wire board which is provided with an insulating protective film to cover a wire pattern and is used in a bent state, a short circuit in the wire pattern is surely prevented, and a break in the wire pattern when bent is conveniently suppressed, thus having superior reliability.

In order to attain the foregoing object, a display module according to the present invention which includes a display panel provided with external connection terminals and a flexible wire board having a wire pattern on a base material, terminals of the wire pattern of the flexible wire board and the external connection terminals of the display panel being bonded using an anisotropic conductive adhesive, the flexible wire board having an insulating protective layer for protecting the wire pattern, wherein: the insulating protective layer of the flexible wire board is extended inside the display panel while having the flexible wire board connected to the display panel.

With this arrangement, the insulating protective layer of the flexible wire board is extended inside the display panel while having the flexible wire board connected to the display panel. Therefore, when the flexible wire board is used in a bent state, the insulating protective layer is provided on an inner side of the flexible wire board in the bent state. This prevents the wire pattern from directly contacting a corner of the display panel, thereby preventing a break in wire of the wire pattern.

As a result, in a flexible wire board which includes an insulating protective film to cover a wire pattern and is used in a bent state, a short circuit in the wire pattern is surely prevented while conveniently suppressing a break in wire of the wire pattern when bent, thereby providing a highly reliable flexible wire board.

Note that, in the Specification of the present application, a description that the insulating protective layer "is extended (so that it comes) inside the display panel" refers to a state in which one end of the insulating protective layer is positioned outside one side (a side in a direction normal to a display screen) of the display panel, while the other end of the insulating protective layer is positioned inside that side of the display panel, that is, the insulating protective layer is positioned so that it crosses one side (the side in the direction normal to the display screen) of the display panel.

Further, in order to attain the foregoing object, a flexible wire board according to the present invention, which has a base material, a wire pattern and an insulating protective layer for protecting the wire pattern on the base material, terminals of the wire pattern being connected to external connection terminals of the display panel by using an anisotropic conductive adhesive, has an arrangement in which the insulating protective layer is extended toward the terminals of the wire pattern so that it comes inside the display panel while having the flexible wire board connected to the display panel.

With this arrangement, the insulating protective layer of the flexible wire board is extended toward the terminals of the wire pattern so that it comes inside the display panel while having the flexible wire board connected to the display panel. Therefore, when the flexible wire board is used in a bent state, the insulating protective layer is provided on an inner side of the flexible wire board in the bent state. This prevents the wire pattern from directly contacting a corner of the display panel, thereby preventing a break in wire of the wire pattern.

As a result, in a flexible wire board which includes an insulating protective film to cover a wire pattern and is used in a bent state, a short circuit in the wire pattern is surely prevented while conveniently suppressing a break in wire of the wire pattern when bent, thereby providing a highly reliable flexible wire board.

In order to attain the foregoing object, a flexible wire board connecting method according to the present invention, in which a flexible wire board includes a base material, and a wire pattern and an insulating protective layer for protecting the wire pattern on the base material, and terminals of the wire pattern are connected to external connection terminals outside a display panel by using an anisotropic conductive adhesive, the method has an arrangement in which the insulating protective layer is extended inside the display panel while having the flexible wire board connected to the display panel.

With this method, when the terminals of the flexible wire board having the wire pattern and the insulating protective layer for protecting the wire pattern on the base material are connected to the external connection terminals outside the display panel by using the anisotropic conductive adhesive, the insulating protective layer of the flexible wire board is extended inside the display panel while having the flexible wire board connected to the display panel.

Consequently, in the case where the flexible wire board is used in a bent state, the insulating protective layer is provided on an inner side of the flexible wire board in the bent state. This prevents the wire pattern from directly contacting a corner of the display panel, thereby preventing a break in wire of the wire pattern.

As a result, in a flexible wire board which includes an insulating protective film to cover a wire pattern and is used in a bent state, a short circuit in the wire pattern is surely prevented while conveniently suppressing a break in wire of the wire pattern when bent, thereby providing a highly reliable flexible wire board connecting method.

Additional objects, features, and strengths of the present invention will be made clear by the description below. Further, the advantages of the present invention will be evident from the following explanation in reference to the drawings.

DESCRIPTION OF THE EMBODIMENTS

[First Embodiment]

The following will explain one embodiment of the present invention with reference to FIGS. 1 through 6.

Note that, in the present embodiment, a liquid crystal module is explained as a display module, though the display module of the present invention is not limited to this, and a different display module may be adopted. Further, the liquid crystal module of the present embodiment is used, for example, for a compact electronic device, such as a mobile phone, a beeper, a game device or the like.

Figure 2:
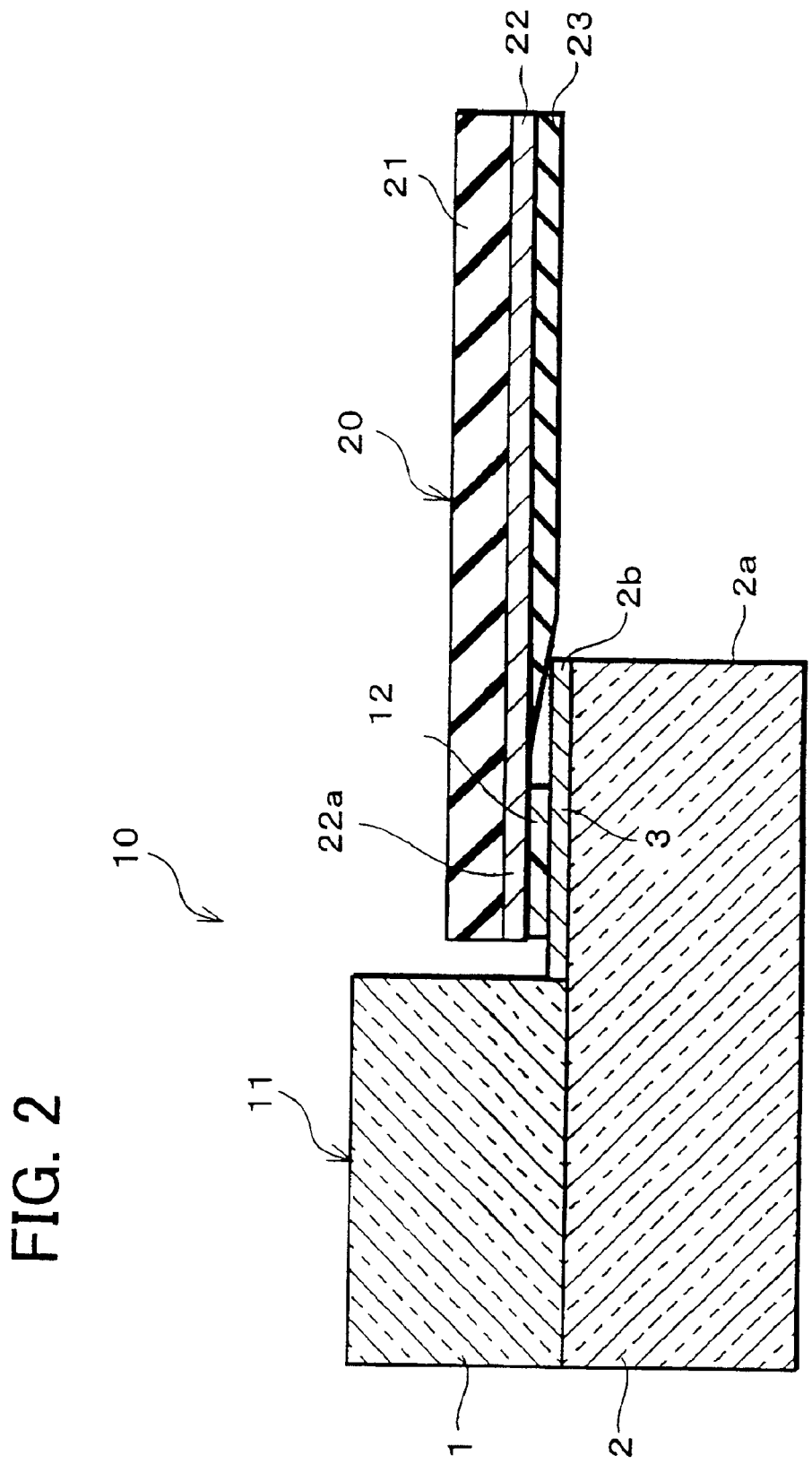
FIG. 2 is a cross-sectional view of the liquid crystal module, in which the flexible wire board is provided horizontally.

As shown in FIG. 2, a liquid crystal module 10 according to the present embodiment is provided with a liquid crystal display panel 11 as a display panel which has an upper glass substrate 1 and a lower glass substrate 2. The upper and lower glass substrates 1 and 2 are sandwiched by not-shown polarizer plates. Between the upper and lower glass substrates 1 and 2 is provided a not-shown liquid crystal layer together with panel electrode terminals 3 which are external connection terminals.

Further, the lower glass substrate 2 is made larger than the upper glass substrate 1, and the lower glass substrate 2 juts out from the upper glass substrate 1. The panel electrode terminals 3 are extended onto the jutting out portion of the lower glass substrate 2, remaining uncovered. Note that, the panel electrode terminals 3 apply a voltage for driving a liquid crystal display panel 11 to a not-shown liquid crystal driving electrode, and are connected to the liquid crystal driving electrode provided within the liquid crystal display panel 11 via a not-shown wire in between.

Further, the liquid crystal module 10 has a semiconductor apparatus which functions as a liquid crystal driver for driving the liquid crystal display panel 11. The semiconductor apparatus is made up of a flexible wire board 20 and a not-shown semiconductor device. The flexible wire board 20 is such that a Cu foil pattern 22, which is a wire pattern, is formed on a surface of a base material 21. The semiconductor device is mounted on an outer surface of the flexible wire board 20, thereby functioning as a liquid crystal driver IC (IC: Integrated Circuit). The semiconductor apparatus thus has the semiconductor device subject to COF (Chip On Film) mounting. A flexible wire board subject to COF mounting as the flexible wire board 20 is commonly called "COF", which is thinner than a flexible wire board subject to TCP mounting.

Note that, in the present embodiment, the Cu foil pattern 22 is adopted as a wire pattern. The wire pattern, however, may alternatively be a pattern made of another conductive material, such as aluminum (Al) or the like.

The base material 21 of the flexible wire board 20 is made up of a thin film of polyimide-base resin or the like, which has a thickness of not more than 40 μm, and more preferably a thickness in a range between 25 μm and 40 μm, thus having sufficient flexibility.

Further, a solder resist 23 which is an insulating protective layer is stacked onto the Cu foil pattern 22 formed on the surface of the flexible wire board 20, by thermocompression bonding. The solder resist 23 is made of a material such as polyimide or the like. The solder resist 23 insulates the Cu foil pattern 22 from the outside while protecting the Cu foil pattern 22 from corrosion, such as the formation of rust or the like, as a protective film. In addition, the solder resist 23 further enhances resistance to bending of the flexible wire board 20. The solder resist 23 preferably has a thickness of not more than 40 μm, and more preferably a thickness in a range between 25 μm and 40 μm. Most preferably, the solder resist 23 has the same thickness as that of the base material 21.

The Cu foil pattern 22 of the flexible wire board 20 is connected with a not-shown semiconductor device via a projection electrode, which connection surface is sealed with resin.

Meanwhile, one end of the flexible wire board 20 that has the Cu foil pattern 22 on its surface is extended toward the liquid crystal display panel 11. A plurality of pattern terminals 22a which make up a terminal portion on an end portion of the Cu foil pattern 22 are connected to an end portion of the panel electrode terminals 3 formed on the lower glass substrate 2 of the liquid crystal display panel 11, by an anisotropic conductive adhesive (ACF: Anisotropic Conductive Film) 12. With this arrangement, the semiconductor device of the semiconductor apparatus according to the present embodiment functions as a liquid crystal driver IC (IC: Integrated Circuit), thus functioning as a liquid crystal driver for driving the liquid crystal display panel 11.

Note that, the other end portion of the flexible wire board 20 opposite to the liquid crystal display panel 11 is connected to a not-shown printed wire board, and power or the like is obtained from a power source circuit or the like via the printed wire board.

The anisotropic conductive adhesive 12 is such that conductive particles are dispersed within an insulating adhesive. The anisotropic conductive adhesive 12 mechanically bonds the panel electrode terminals 3 and the pattern terminals 22a, while, with the conductive particles, electrically connecting the panel electrode terminals 3 with the pattern terminals 22a.

Preferably used as the adhesive is a thermo-setting adhesive of, for example, epoxy-base resin, acrylic resin or the like because the thermo-setting adhesive is capable of thermocompression bonding.

Available as the conductive particles are metal particles of Ni or the like, Au-plated metal particles in which the metal particles of Ni or the like are plated with Au, carbon particles, plated thermoplastic resin particles in which thermoplastic resin particles (plastic particles) are given Au plating, Au/Ni plating (an Ni layer is first formed as a base coat, which is then plated with Au) or other plating, transparent conductive particles such as ITO (Indium Tin Oxide) and the like, conductive particles complex plastic in which the metal particles of Ni or the like are blended with polyurethane, and others. Among them, most preferable as the conductive particles are the plated thermoplastic resin particles. A particle size of the conductive particle is preferably in a range between 3 $\mu$m and 12 $\mu$m. Further, preferable as the plated thermoplastic resin particles are plated thermoplastic resin particles having a particle size of 3 $\mu$m to 5 $\mu$m.

Further, available as the anisotropic conductive adhesive 12 are film-type and paste-type anisotropic conductive adhesives, of which preferable is a film-type anisotropic conductive adhesive, rather than a paste-type anisotropic conductive adhesive, because of its easy handling and accurate thickness adjustability.

Here, in the case of the liquid crystal module 10 according to the present embodiment, the solder resist 23 is extended inside the liquid crystal display panel 11. More specifically, the solder resist 23 of the flexible wire board 20 is extended beyond an edge (edge of a terminal portion) 2a of the lower glass substrate 2 of the liquid crystal display panel 11.

Figure 1:
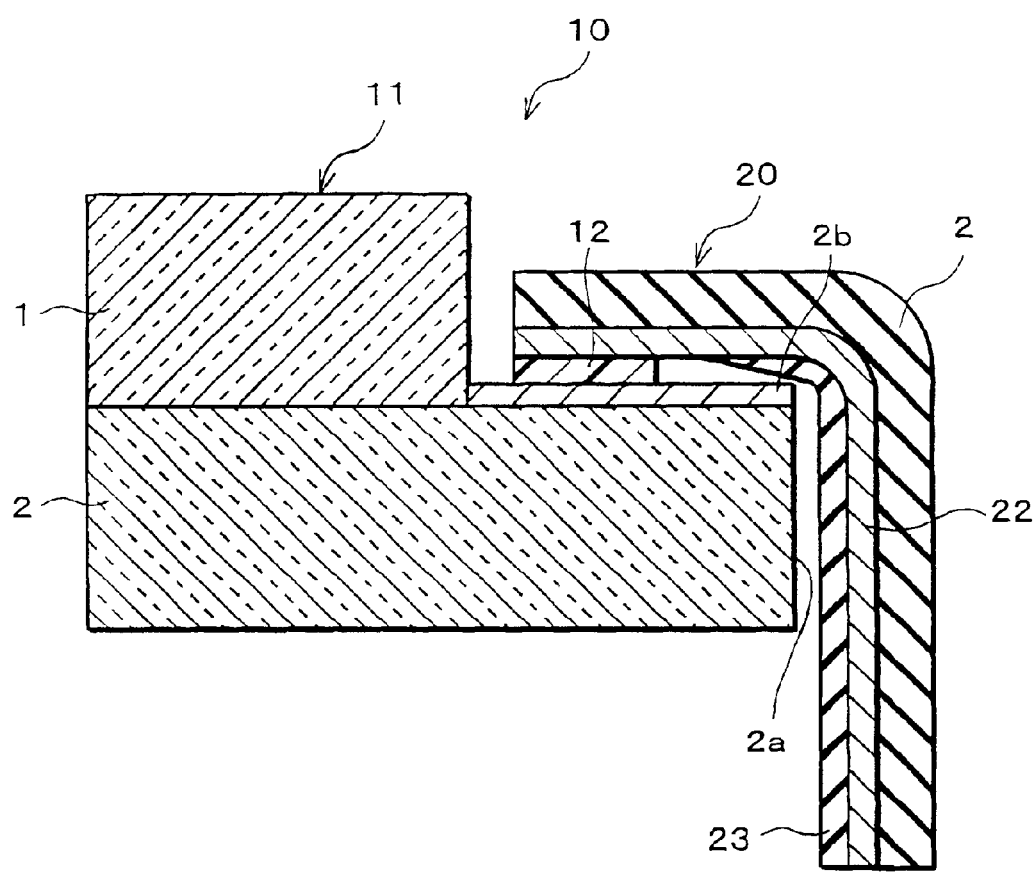
FIG. 1 is a cross-sectional view of one embodiment of a liquid crystal module according to the present invention, in which a flexible wire board is bent.

Accordingly, as shown in FIG. 1, even when the flexible wire board 20 is bent with the edge 2a of the lower glass substrate 2 of the liquid crystal display panel 11 inside, the Cu foil pattern 22 does not contact a terminal corner 2b of the edge 2a of the lower glass substrate 2.

Therefore, it is possible to prevent a break in wire of the Cu foil pattern 22 which may be caused by contact of the Cu foil pattern 22 with the terminal corner 2b.

Figure 3:
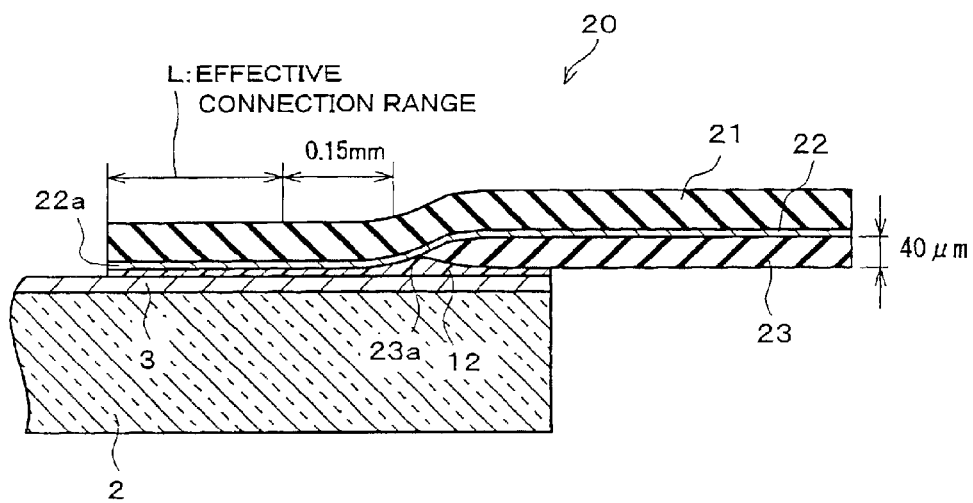
FIG. 3 is a cross-sectional view showing the flexible wire board of the liquid crystal module, in which a solder resist is extended onto a lower glass substrate.
Figure 4:
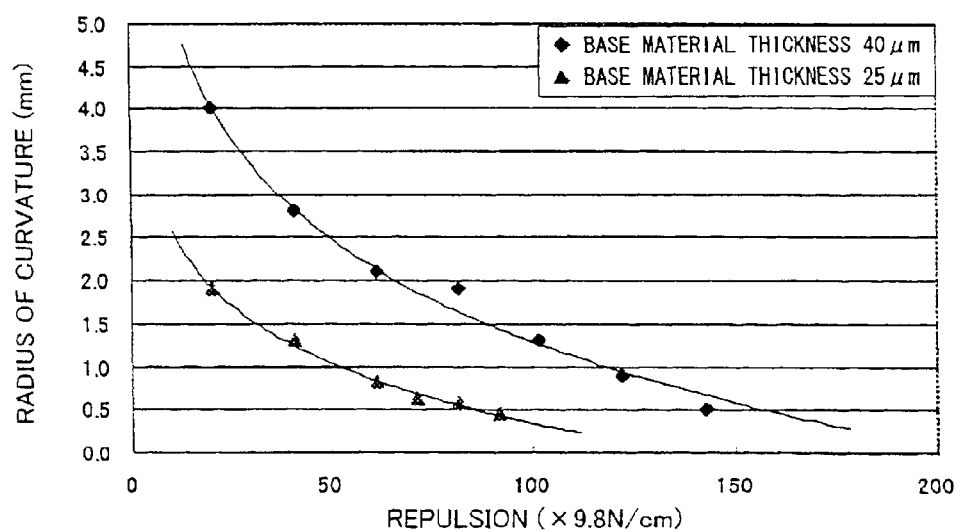
FIG. 4 is a characteristic view showing a relation between repulsion and a radius (R) of curvature with respect to a base material thickness of the flexible wire board.

Here, as shown in FIG. 3, a degree of extension of the solder resist 23 onto the lower glass substrate 2 is closely related to a thickness of the base material 21 and a thickness of the solder resist 23. Namely, as the thickness of the base material 21 increases, as shown in FIG. 4, repulsion in the flexible wire board 20 grows stronger.

Therefore, as shown in FIG. 3, when the flexible wire board 20 is bonded onto the lower glass substrate 2 with the anisotropic conductive adhesive 12, it is necessary that the anisotropic conductive adhesive 12 is first applied to the lower glass substrate 2 so as to perform tentative compression bonding for deciding positions. Here, as the thickness of the base material 21 increases, repulsion in the base material 21 grows stronger, which prevents tentative compression bonding from being performed. More specifically, in the case of a conventional TCP-mounting flexible wire board having a base material thickness of about 75 $\mu$m and therefore lacking flexibility, extending a solder resist onto the liquid crystal display panel 11 results in peeling and/or deviation of the flexible wire board 20 at the time of tentative compression bonding due to poor compression bonding performance.

On the other hand, as is clear from FIG. 3, as the thickness of the solder resist 23 increases, an interval between an edge 23a of the solder resist 23 and an effective connection portion (range) L becomes larger, thereby narrowing a connection range of the pattern terminals 22a. In the present embodiment, as discussed, the base material 21 has a thickness of not more than 40 $\mu$m, and the thickness of the solder resist 23 too is not more than 40 $\mu$m, thereby satisfying connection reliability in this respect. In other words, extending the solder resist 23 onto the liquid crystal display panel 11 cannot be attained in the case of the conventional TCP-mounting flexible wire board. This, however, is realized by the flexible wire board 20 having a thin COF-mounting base material 21.

As described, in the liquid crystal module 10 according to the present embodiment, a connection state of the solder resist 23 of the flexible wire board 20 is connected to the liquid crystal display panel 11 in such a manner that the solder resist 23 of the flexible wire board 20 is extended inside the liquid crystal display panel 11. Therefore, when the flexible wire board 20 is used in a bent state, the solder resist 23 is on an inner side of the bent flexible wire board 20. Accordingly, the Cu foil pattern 22 does not directly contact the terminal corner 2b of the liquid crystal display panel 11, thereby preventing a break in wire of the Cu foil pattern 22.

As a result, a short circuit in the Cu foil pattern 22 is surely prevented in the flexible wire board 20 which is provided with the solder resist 23 to cover the Cu foil pattern 22 and is used in a bent state. Namely, it is possible to prevent a short circuit which may possibly occur in an uncovered portion of the Cu foil pattern 22 when the solder resist 23 is not extended onto the liquid crystal display panel 11. Moreover, a break in wire of the Cu foil pattern 22 when bent is conveniently suppressed, thereby providing the liquid crystal display module 10 having superior reliability.

Further, in the case of the liquid crystal display module 10 according to the present embodiment, the base material 21 of the flexible wire board 20 has a thickness of not more than 40 $\mu$m. The base material 21 is thus thinner than a 75 $\mu$m base material of a conventional TCP-mounting flexible wire board. Further, the solder resist 23 too has a thickness of not more than 40 $\mu$m, and is bonded by thermocompression bonding to the base material 21 including the Cu foil pattern 22. Therefore, an adhesive is not used, and the flexible wire board 20 in its entirety is thin. Further, the solder resist 23 is generally richer in flexibility than the base material 21, and the thickness thereof is not more than 40 $\mu$m. The solder resist 23 thus has sufficient flexibility for bending, thereby easily bending the flexible wire board 20.

Note that, the present invention is not limited to the foregoing embodiment, but may be applied in many variations within the scope of the present invention. For example, in the foregoing embodiment, the anisotropic conductive adhesive 12 is provided between the panel electrode terminals 3 and the pattern terminals 22a, and is extended inside the lower glass substrate 2.

The provision of the anisotropic conductive adhesive 12, however, is not limited to this. A variation as shown in FIG. 5, for example, can be adopted, in which the anisotropic conductive adhesive 12 is replaced with an anisotropic conductive adhesive 13 which protrudes from the edge 2a of the lower glass substrate 2.

Figure 5:
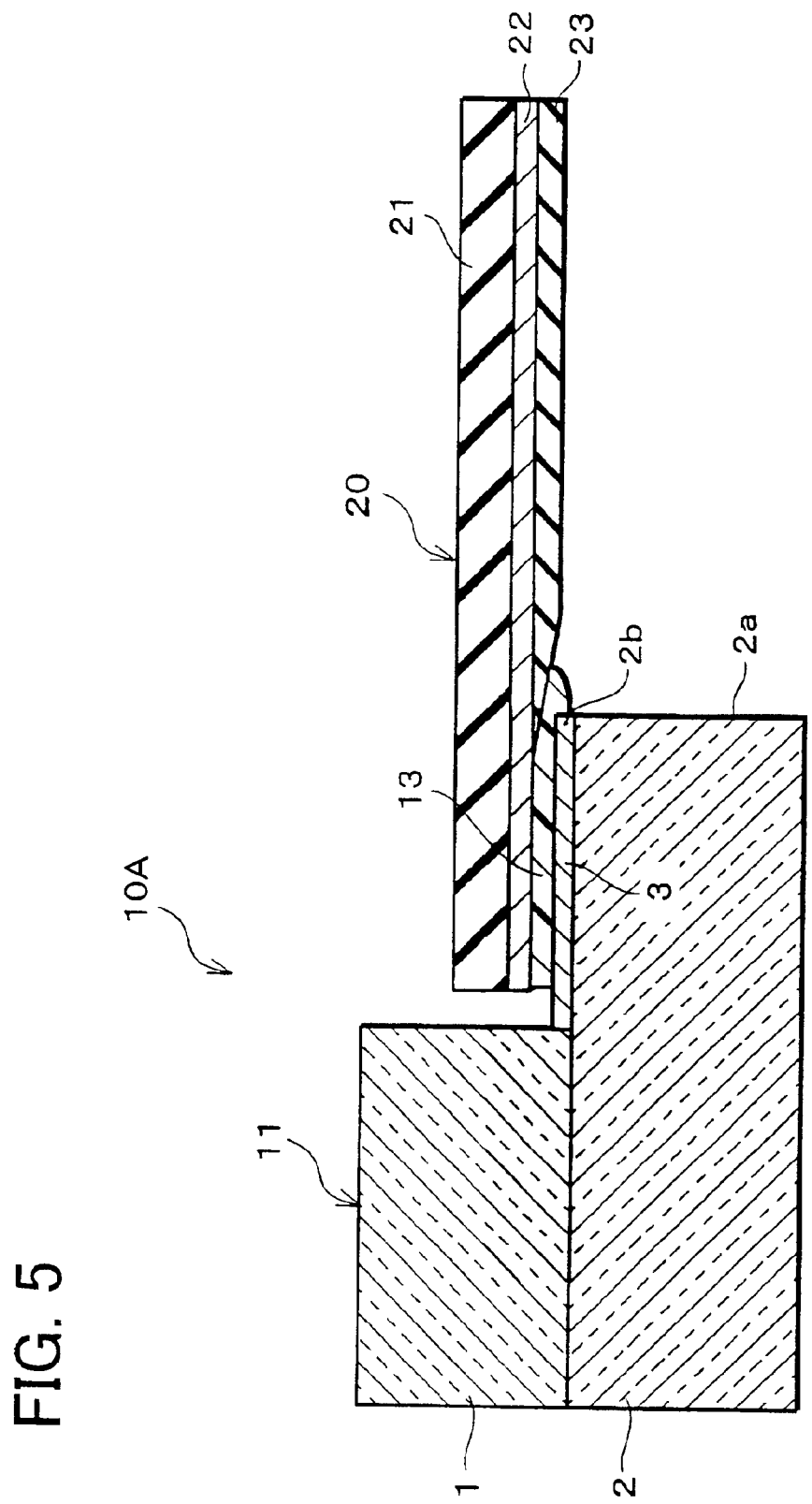
FIG. 5 is a cross-sectional view of the flexible wire board, in which even an anisotropic conductive adhesive protrudes from the lower glass substrate.

More specifically, in the case of a liquid crystal module 10A according to another embodiment of the present invention, as shown in FIG. 5, the solder resist 23 is extended onto the lower glass substrate 2, and the anisotropic conductive adhesive 13 protrudes from the edge (end) 2a to the outside. Note that, here, the anisotropic conductive adhesive 13 is stacked on the solder resist 23. The anisotropic conductive adhesive 13 has the same composition as that of the anisotropic conductive adhesive 12 except for a point that it protrudes from the edge 2a of the lower glass substrate 2.

Figure 6:
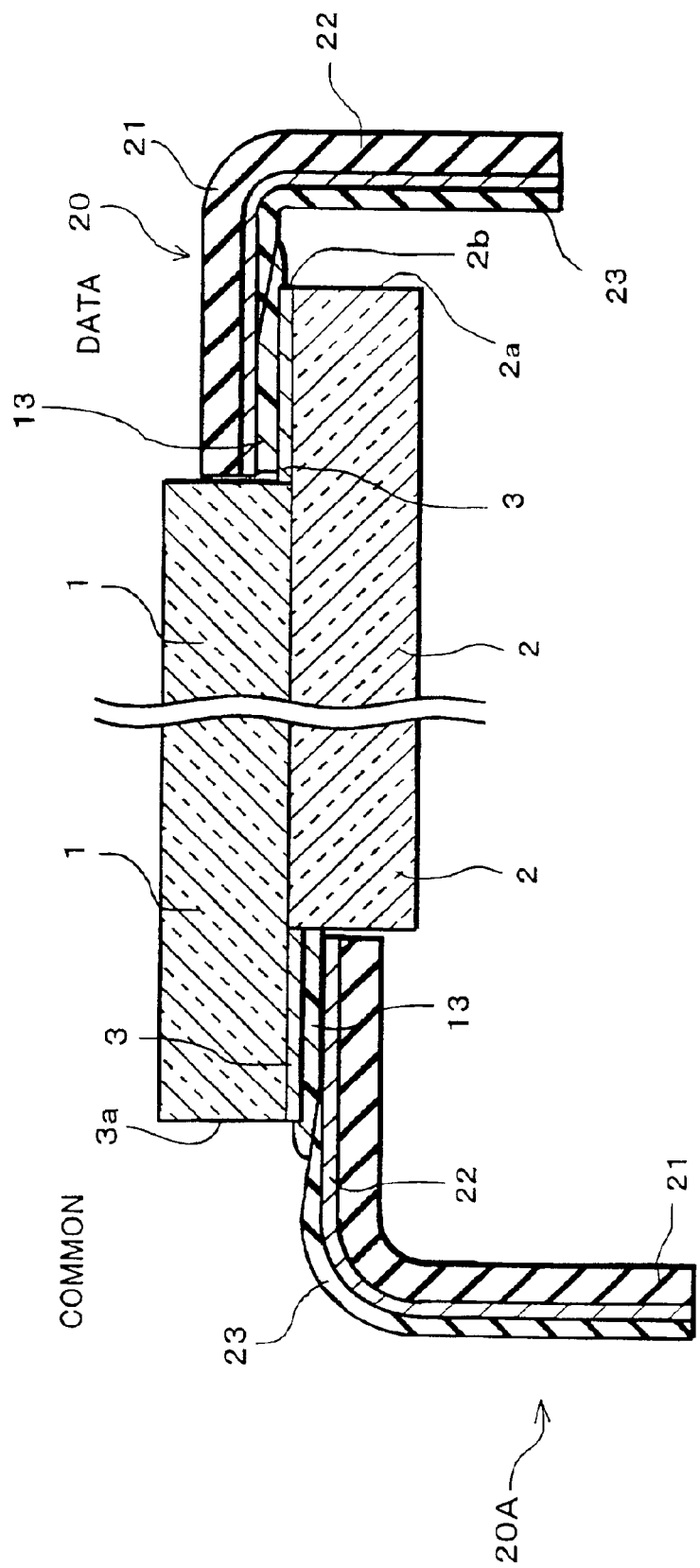
FIG. 6 is a cross-sectional view of the flexible wire board of FIG. 5 in a bent state.

With this arrangement, as shown in FIG. 6, the Cu foil pattern 22 does not contact the corner 2b of the edge 2a of the lower glass substrate 2 even when the flexible wire board 20A is bent with the edge 2a of the lower glass substrate 2 of the liquid crystal display panel 11 inside. Note that, in FIG. 6, since the anisotropic conductive adhesive 13 is relatively solid, it fails to have as much flexibility as that of the flexible wire board 20 of FIG. 1 in which the solder resist 23 alone is provided in the bent portion.

Further, in FIG. 6, the solder resist 23 of the flexible wire board 20A is extended inside the liquid crystal display panel 11, beyond the edge (edge 3a of the upper glass substrate 3) of the liquid crystal panel 11 on a 'common' side as it is done so on a 'data' side. Note that, shown here is the common-side flexible wire board 20A attached to the upper glass substrate 1, which flexible wire board 20A being bent toward the side of the base material 21. That is, the arrangement of the present embodiment is applicable to a case where the flexible wire board 20A is not bent with the liquid crystal display panel 11 inside. In that case, the Cu foil pattern 22 does not have an uncovered portion, thereby making it possible to prevent a leak or the like caused by the adhesion of dirt. Moreover, the anisotropic conductive adhesive 13 which protrudes from the liquid crystal display panel 11 causes the flexible wire board 20 to adhere to the liquid crystal display panel 11 at an edge of the liquid crystal display panel 11, thereby surely preventing the flexible wire board 20 from peeling off the liquid crystal display panel 11 when the flexible wire board 20 is bent to the outside.

As described, in the case of the liquid crystal module 10A according to the present embodiment, the solder resist 23 is extended to reach the pattern terminals 22a of the Cu foil pattern 22 of the flexible wire board 20. Therefore, the anisotropic conductive adhesive 13 is provided as an upper layer of the solder resist 23. Moreover, in the present embodiment, the anisotropic conductive adhesive 13 may be set so that it protrudes from the liquid crystal display panel 11.

Accordingly, in the case of using the flexible wire board 20 by bending it, on an inner side of the bent flexible wire board 20 exist the solder resist 23 as well as the anisotropic conductive adhesive 13 on the solder resist 23. Thus, when using the flexible wire board 20 by bending it, the anisotropic conductive adhesive 13 is bent so that it contacts the corner 2b of the liquid crystal display panel 11. This prevents the Cu foil pattern 22 from directly contacting the corner 2b of the liquid crystal display panel 11. Moreover, it is a double layer of the anisotropic conductive adhesive 13 and the solder resist 23 that contacts the corner 2b of the liquid crystal display panel 11, thereby preventing a break in wire of the Cu foil pattern 22 more surely than the liquid crystal module 10.

Further, setting the anisotropic conductive adhesive 13 so that it protrudes from the liquid crystal display panel 11 causes the flexible wire board 20 to adhere to the liquid crystal display panel 11 at an edge of the liquid crystal display panel 11, thereby making it more difficult that the flexible wire board 20 peels off the liquid crystal display panel 11.

Further, in the case where the flexible wire board 20 alone is bent, different coefficients of bending elasticity in portions with and without the solder resist 23, respectively, are likely to cause bending stress to be focused on the border of the two portions, i.e., on a tip portion of the solder resist 23. On the other hand, in the case of the liquid crystal module 10 according to the present embodiment, the periphery of the tip of the solder resist 23, where bending stress tends to be focused when the flexible wire board 20 is bent, is bonded onto a surface of the liquid crystal display panel 11 by the anisotropic conductive adhesive 13, thereby preventing bending stress from being focused on the tip portion of the solder resist 23, while preventing a break in wire of the Cu foil pattern 22 due to bending stress in the tip portion of the solder resist 23, when the flexible wire board 20 is bent.

Further, in the flexible wire board 20 according to the present embodiment, the solder resist 23 of the flexible wire board 20 is extended toward the pattern terminals 22a of the Cu foil pattern 22 so that it comes inside the liquid crystal display panel 11 when connected to the liquid crystal display panel 11.

Therefore, in the case of using the flexible wire board 20 by bending it, the solder resist 23 is provided on the inner side of the bent flexible wire board 20. This prevents the Cu foil pattern 22 from directly contacting the corner 2b of the liquid crystal display panel 11, thereby preventing a break in wire of the Cu foil pattern 22.

As a result, it is possible to provide a highly reliable flexible wire board 20, which includes the solder resist 23 to cover the Cu foil pattern 22 and is used in a bent state, by surely preventing a short circuit in the Cu foil pattern 22 and conveniently suppressing a break in wire of the Cu foil pattern 22 when bent.

Further, according to a method of connecting the flexible wire board 20 of the present embodiment, when connecting the pattern terminals 22a of the flexible wire board 20 to the panel electrode terminals 3 of the liquid crystal display panel 11 by using the anisotropic conductive adhesive 12, the flexible wire board 20 on which the base material 21, the Cu foil pattern 22 and the solder resist 23 to protect the Cu foil pattern 22 are stacked in this order, then the solder resist 23 of the flexible wire board 20 is extended inside the liquid crystal display panel 11 while having the flexible wire board 20 connected to the liquid crystal display panel 11.

Therefore, in the case of using the flexible wire board 20 by bending it, the solder resist 23 is provided on the inner side of the bent flexible wire board 20. This prevents the Cu foil pattern 22 from directly contacting the corner 2b of the liquid crystal display panel 11, thereby preventing a break in wire of the Cu foil pattern 22.

As a result, it is possible to provide a highly reliable flexible wire board 20, which includes the solder resist 23 to cover the Cu foil pattern 22 and is used in a bent state, by surely preventing a short circuit in the Cu foil pattern 22 and conveniently suppressing a break in wire of the Cu foil pattern 22 when bent.

Further, according to a method of connecting the flexible wire board 20 of the present embodiment, the solder resist 23 is extended to reach the pattern 22a of the Cu foil pattern 22 of the flexible wire board 20. Therefore, the anisotropic conductive adhesive 13 is provided as an upper layer of the solder resist 23. In addition, in the present embodiment, the anisotropic conductive adhesive 13 is extended to protrude from the liquid crystal display panel 11.

Accordingly, in the case of using the flexible wire board 20 by bending it, on an inner side of the bent flexible wire board 20 exist the solder resist 23 as well as the anisotropic conductive adhesive 13 on the solder resist 23. Thus, when using the flexible wire board 20 by bending it, the anisotropic conductive adhesive 13 is bent so that it contacts the corner 2b of the liquid crystal display panel 11. This prevents the Cu foil pattern 22 from directly contacting the corner 2b of the liquid crystal display panel 11. Moreover, it is a double layer of the anisotropic conductive adhesive 13 and the solder resist 23 that contacts the corner 2b of the liquid crystal display panel 11, thereby preventing a break in wire of the Cu foil pattern 22 more surely.

Further, setting the anisotropic conductive adhesive 13 so that it protrudes from the liquid crystal display panel 11 causes the flexible wire board 20 to adhere to the liquid crystal display panel 11 at an edge of the liquid crystal display panel 11, thereby making it more difficult that the flexible wire board 20 peels off the liquid crystal display panel 11.

[Second Embodiment]

Figure 7:
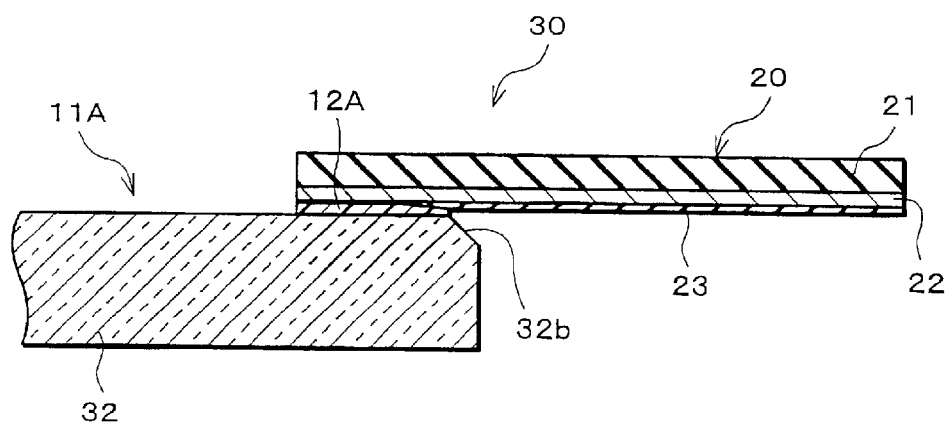
FIG. 7 is a cross-sectional view of another embodiment of the liquid crystal module according to the present invention, in which a lower glass substrate is given a chamfered portion, and a solder resist is extended onto the lower glass substrate.
Figure 8:
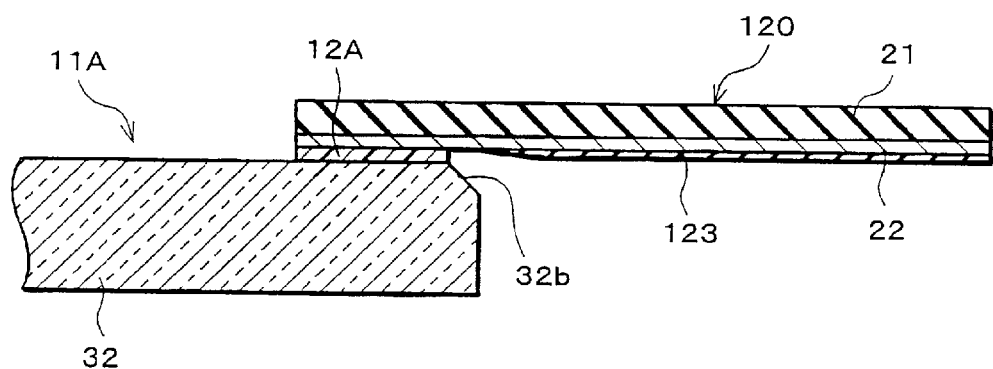
FIG. 8 is a cross-sectional view of a comparative example of FIG. 7, in which the solder resist is not extended onto the lower glass substrate.

The following will describe another embodiment of the present invention with reference to FIGS. 7 and 8. For ease of explanation, members having the same functions as those shown in the drawings pertaining to the First Embodiment above will be given the same reference numerals, and explanation thereof will be omitted here. Further, various features described in the First Embodiment will be considered applicable in combination in the present embodiment.

A liquid crystal module 30 according to the present embodiment, as shown in FIG. 7, has the same arrangement as that of a liquid crystal module 10 of FIG. 2 according to the First Embodiment, provided that a liquid crystal display panel 11 is replaced with a liquid crystal display panel 11A having a lower glass substrate 32. The lower glass substrate 32 has a chamfered portion 32b in lieu of the corner 2b of the liquid crystal module 10.

Further, in the present embodiment, too, a solder resist 23 of a flexible wire board 20 is extended inside an upper surface of the lower glass substrate 32 (i.e., to the inside beyond the chamfered portion 32b). Note that, an anisotropic conductive adhesive 12A has the same composition as that of an anisotropic conductive adhesive 12, except for a point that the anisotropic conductive adhesive 12A is applied to panel electrode terminals 3 so that a tip thereof reaches an upper edge of the chamfered portion 32b unlike the anisotropic conductive adhesive 12.

In the case of the liquid crystal module 30 thus arranged, even when the flexible wire board 20 is bent at a position of the chamfered portion 32b of the lower glass substrate 32, the Cu foil pattern 22 of a base material 21 contacts the chamfered portion 32b indirectly, that is, via the solder resist 23, thereby preventing a break in wire of the Cu foil pattern 22.

Note that, shown in FIG. 8 is a comparative example, in which a flexible wire board 120 has the chamfered portion 32b whose contact portion is free from a solder resist 123. In the case of using this flexible wire board 120, the Cu foil pattern 22 contacts the chamfered portion 32b when the flexible wire board 120 is bent, thereby easily causing a break in wire of the Cu foil pattern 22. Further, in this case, a foreign substance adheres to an uncovered portion of the Cu foil pattern 22, which may cause a leak or break in wire.

As described, in the liquid crystal module 30 according to the present embodiment, the chamfered portion 32b is formed at a corner of the lower glass substrate 32 which corresponds to a corner of the liquid crystal display panel 11, the corner facing an inner side of the bent flexible wire board 20. This widens a contact portion of the flexible wire board 20 which contacts the liquid crystal display panel 11, thereby preventing bending force from locally acting on the Cu foil pattern 22 when the flexible wire board 20 is bent. Moreover, according to the present embodiment, the solder resist 23 is extended inside the liquid crystal display panel 11 beyond the chamfered portion 32b, thereby causing the solder resist 23 to contact the wide chamfered portion 32b.

As a result, in the flexible wire board 20, a short circuit in the Cu foil pattern 22 is surely prevented, while conveniently and surely suppressing a break in wire of the Cu foil pattern 22 when bent, thereby providing a highly reliable liquid crystal display module 30.

Further, in the case of the liquid crystal module 30 according to the present embodiment, the periphery of a tip of the solder resist 23, on which bending stress tends to be focused when the flexible wire board 20 is bent, is bonded onto a surface of the liquid crystal display panel 11 by the anisotropic conductive adhesive 12A. This prevents bending stress from being focused on a tip portion of the solder resist 23 when the flexible wire board 20 is bent, thereby preventing a break in wire of the Cu foil pattern 22 which may be caused by bending stress on the tip portion of the solder resist 23.

Note that, in the present embodiment, available is an arrangement as described in the First Embodiment above, in which the anisotropic conductive adhesive 13 protrudes from the chamfered portion 32b of the lower glass substrate 32.

[Third Embodiment]

Figure 9:
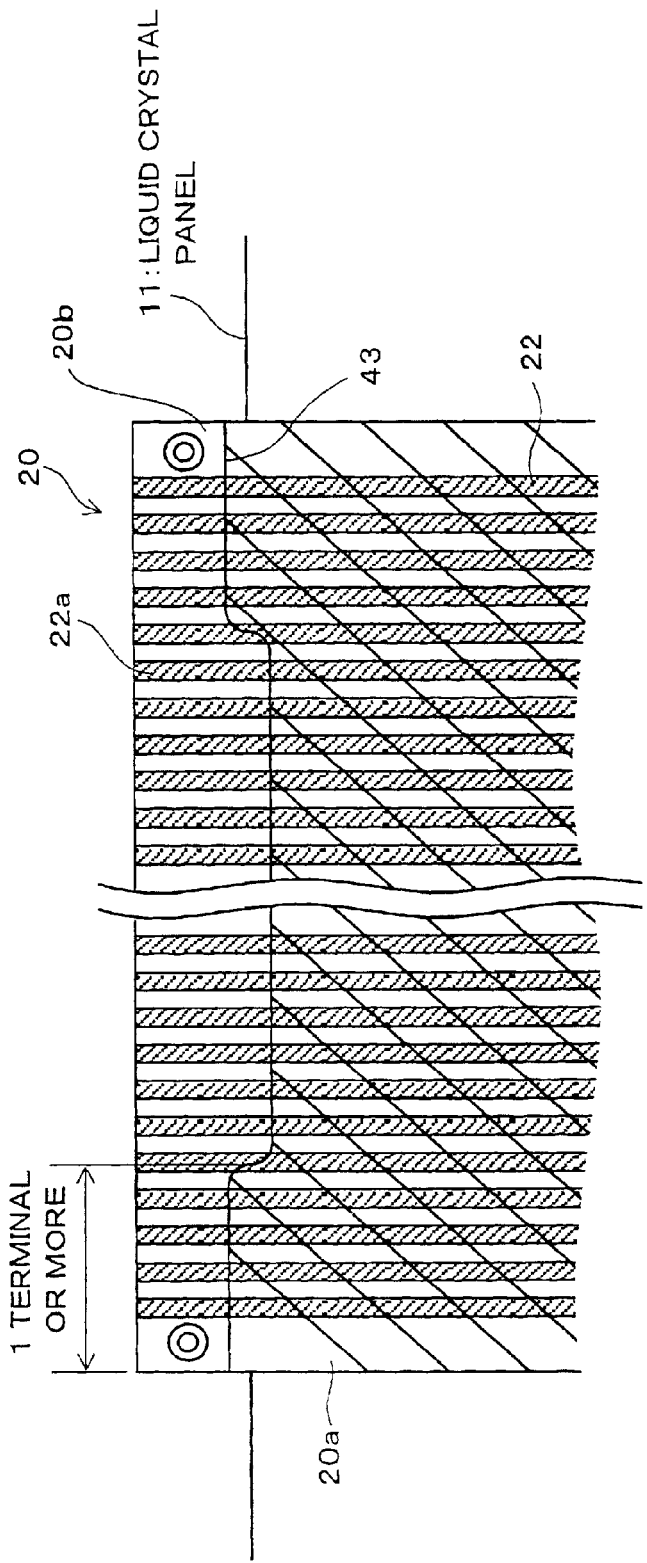
FIG. 9 is a plan view showing still another embodiment of a liquid crystal module according to the present invention.
Figure 10:
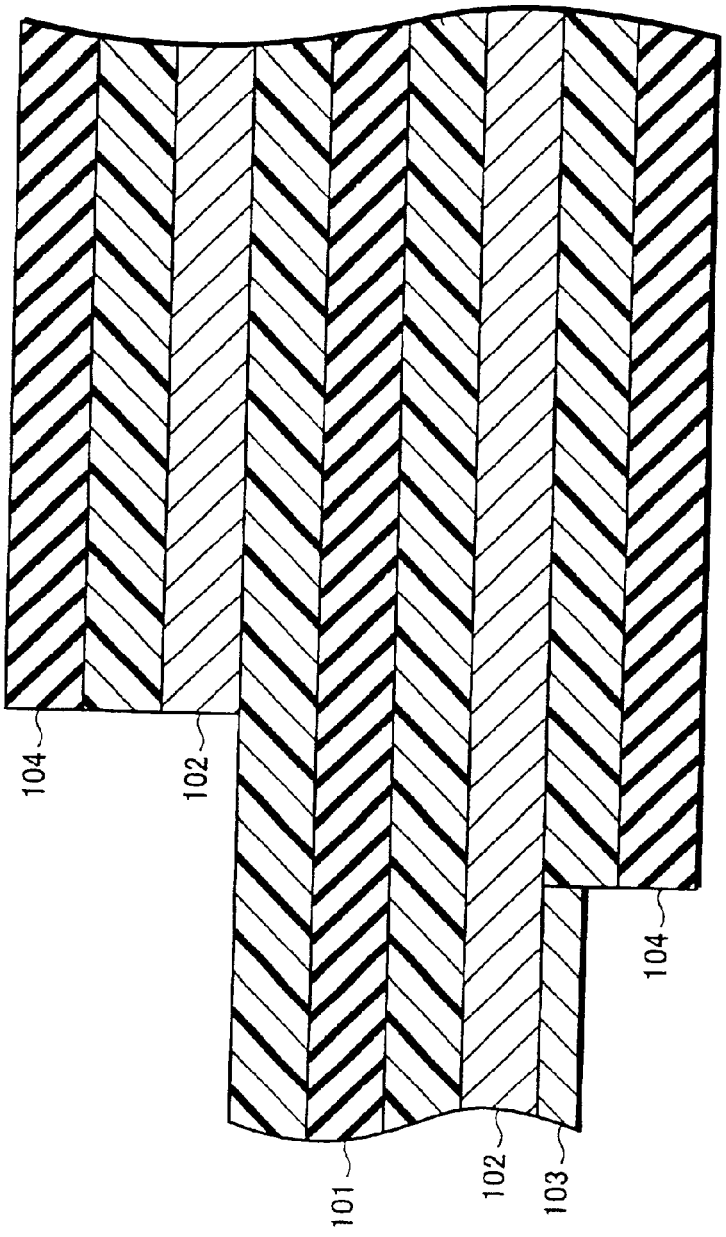
FIG. 10 is a cross-sectional view of a TCP-mounting flexible wire board of a conventional liquid crystal module.

The following will explain another embodiment of the present invention with reference to FIG. 9. For ease of explanation, members having the same functions as those shown in the drawings pertaining to the First and Second Embodiments above will be given the same reference numerals, and explanation thereof will be omitted here. Further, various features described in the First and Second Embodiments will be considered applicable in combination in the present embodiment.

A liquid crystal module 40 according to the present embodiment, as shown in FIG. 9, has an arrangement in which, in the liquid crystal modules 10 and 30 respectively described in the First and Second Embodiments, a solder resist 23 is extended onto a lower glass substrate 2 only through left and right sides 20a and 20b in a direction of a width of each flexible wire board 20.

The reason lies in the fact that a break in wire of the Cu foil pattern 22, which is caused by an edge 2a of the lower glass substrate 2 in contact with the Cu foil pattern 22 when the flexible wire board 20 is bent, mostly occurs on the left and right sides 20a and 20b of the flexible wire board 20 from an empirical point of view. Hence, the occurrence of a break can be suppressed if a solder resist 43 is extended only through these sides.

Accordingly, in the present embodiment, as shown in FIG. 9, it is arranged so that the solder resist 43 is extended only through left and right sides of the Cu foil pattern 22 of the flexible wire board 20. Here, the "left and right sides of the Cu foil pattern 22" refers to one pattern terminal 22a or more respectively from the left and right. More specifically, it is preferable that the solder resist 43 is extended to cover four pattern terminals 22a or so, for example, for each of the left and right sides.

Note that, though not shown in FIG. 9, the anisotropic conductive adhesive 13 can protrude from the lower glass substrate 2, i.e., from the liquid crystal display panel 11, in addition to the arrangement allowing the extension of the solder resist 43.

As described, in the liquid crystal module 40 according to the present embodiment, the solder resist 43 of the flexible wire board 20 is extended inside the liquid crystal display panel 11 only through the both sides 20a and 20b in the direction of the width of the flexible wire board 20.

Consequently, a break in wire of the Cu foil pattern 22, which may occur when the Cu foil pattern 22 is bent, can efficiently be suppressed.

[Fourth Embodiment]

Figure 11:
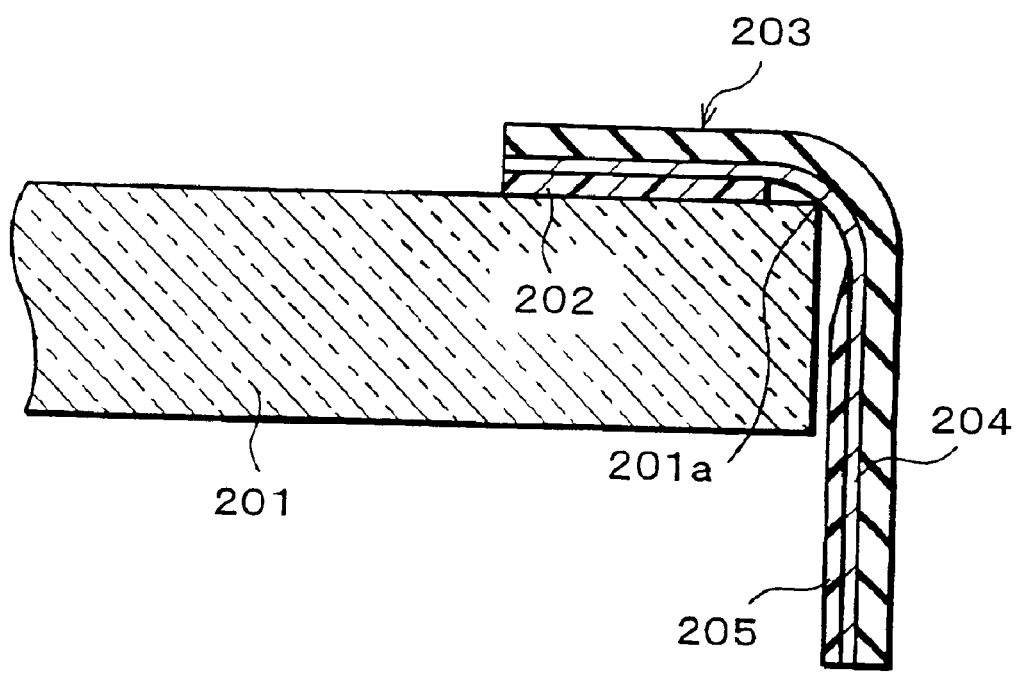
FIG. 11 is a cross-sectional view of a COF-mounting flexible wire board of a conventional liquid crystal module.

Meanwhile, in a flexible wire board 203 having a conventional arrangement as shown in FIG. 11, a portion of a Cu foil pattern 22, which is covered with a solder resist 205 and a portion (plated portion) of the Cu foil pattern 22 left uncovered have considerably different coefficients of bending elasticity. Accordingly, the portion of the Cu foil pattern 22 covered with the solder resist 205 is difficult to bend, and on the other hand, the portion of the Cu foil pattern 22 left uncovered is easy to bend. As a result, bending stress tends to be focused on the border of the two portions, i.e., a tip portion (an end facing a display panel) of the solder resist 205. Therefore, the conventional arrangement of FIG. 11 is likely to experience a break in wire of the Cu foil pattern 22 at the tip portion of the solder resist 205, caused by bending stress focused thereon.

Particularly, when, in order to downsize a frame of a display module (display device), a flexible wire board 203 is bent to a small radius of curvature in the vicinity of a corner 201a of a liquid crystal display panel 201, the Cu foil pattern 22 is likely to contact the corner 201a of the liquid crystal display panel 201. In addition, as is clear from FIG. 4, the smaller the radius of curvature, the greater the bending stress becomes. In accordance with this, greater bending stress is added to the tip portion (the end facing the display panel) of the solder resist 205. In that case, therefore, a break in wire of the Cu foil pattern 22 is particularly easy to occur in the vicinity of the corner 201a of the liquid crystal display panel 201. Accordingly, in order to prevent a break in wire of the Cu foil pattern 22 when the conventional flexible wire board 203 having the arrangement of FIG. 11 is bent, a radius of curvature should be set large so that the portion of the Cu foil pattern 22 covered with the solder resist 205 is bent. Consequently, with the conventional arrangement of FIG. 11, it is difficult to downsize a frame of a display module while preventing a break in wire of the Cu foil pattern 22.

Further, even in a comparative example shown in FIG. 8, as discussed, the Cu foil pattern 22 remains uncovered in the vicinity of a corner of a liquid crystal display panel 11A. Therefore, when the Cu foil pattern 22 is bent in the vicinity of the corner of the liquid crystal display panel 11A, the Cu foil pattern 22 contacts the corner of the liquid crystal display panel 11A, which results in easy occurrence of a break in wire of the Cu foil pattern 22. In addition, in that case, bending stress is focused on the tip portion of the solder resist 205, which also causes easy occurrence of a break in wire of the Cu foil pattern 22.

Further, in the case where a lower glass substrate 32 is chipped at the corner of the liquid crystal display panel 11A, a break in wire of the Cu foil pattern 22 more noticeably occurs, which causes an increase in manufacturing costs.

Figure 12:
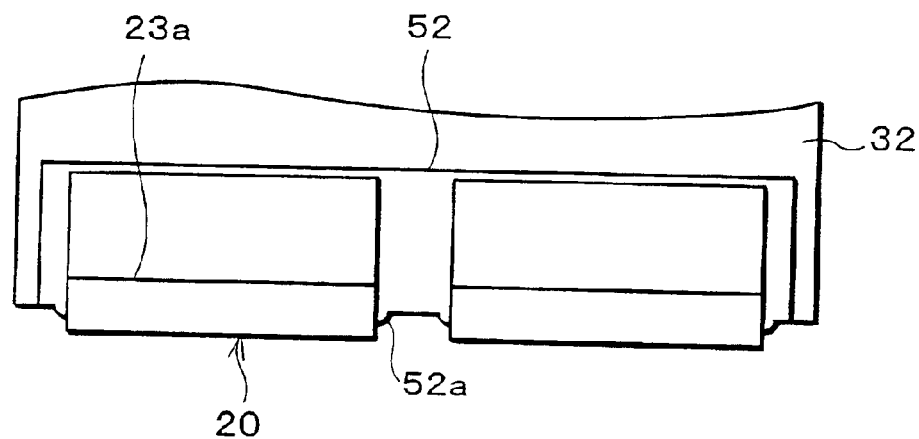
FIG. 12(a) is a plan view of a liquid crystal module according to another embodiment of the present invention.
FIG. 12(b) is a cross sectional view thereof.
Figure 12:
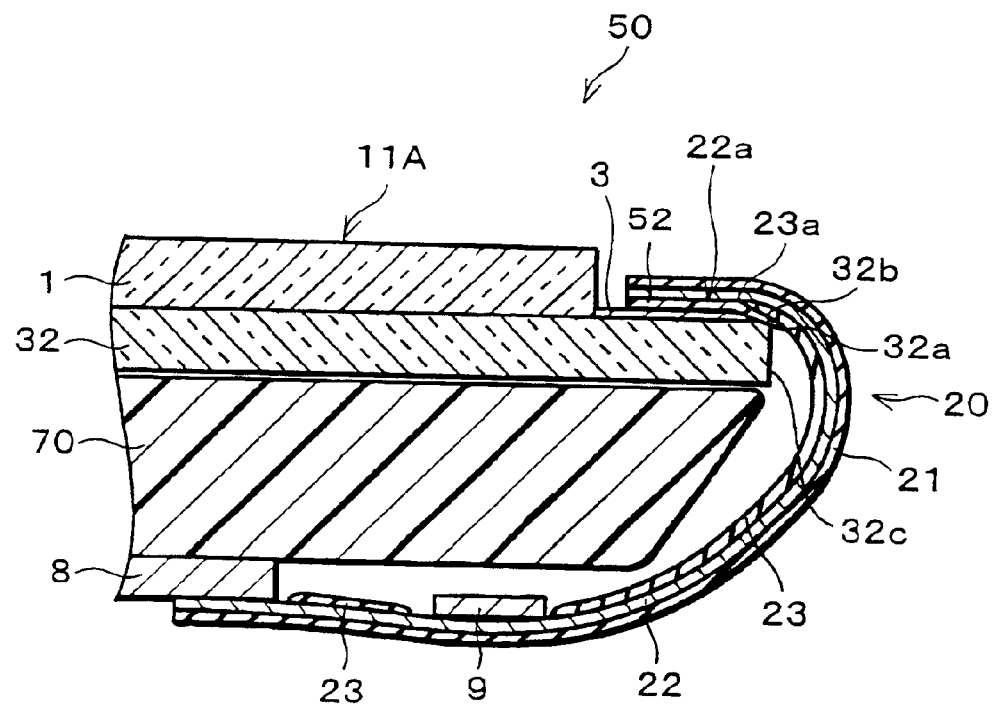
Figure 13:
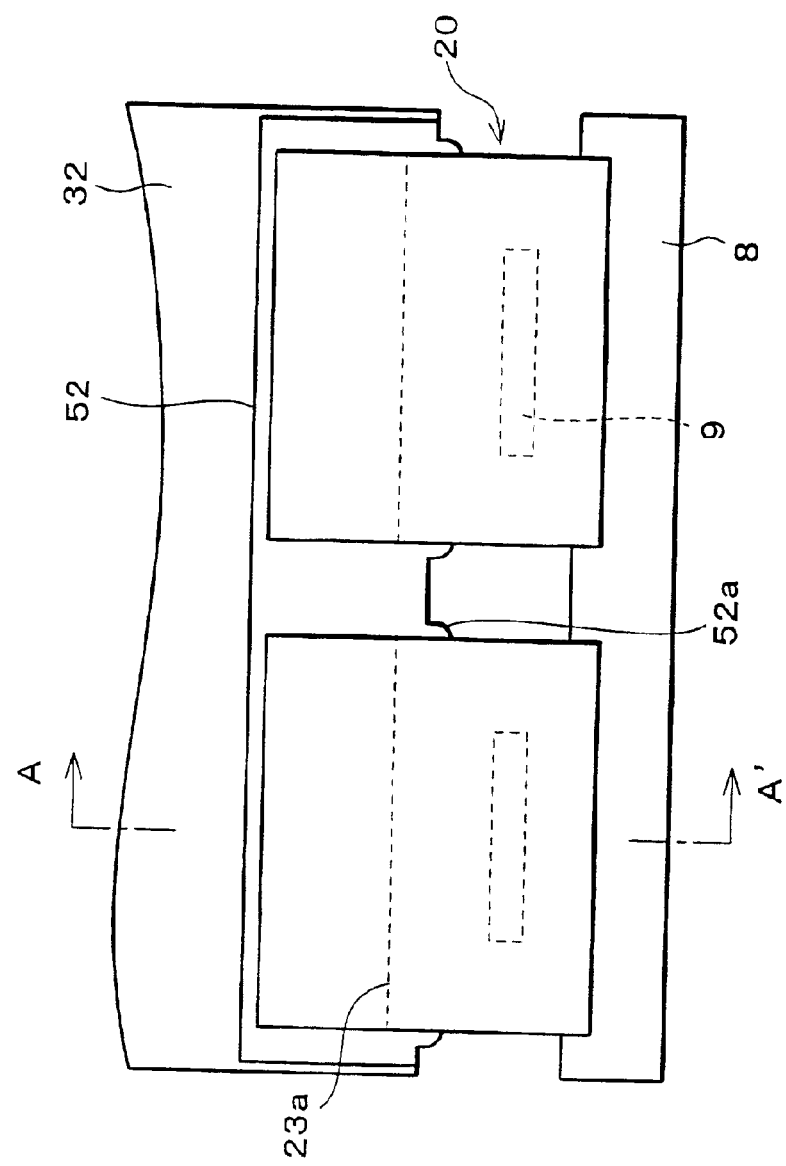
FIG. 13(a) is a plan view showing a liquid crystal module, which is halfway through manufacture, according to another embodiment of the present invention, and FIG. 13 (b) is a cross-sectional view of FIG. 13 (a) taken along the line A–A'.

The following will describe still another embodiment of the present invention, which is capable of solving all these problems, with reference to FIGS. 12(a), 12(b), 13(a) and 13(b). FIGS. 12(a) and 12(b) are plan and cross-sectional views of a completed liquid crystal module. FIGS. 13(a) and 13(b) are plan and cross-sectional views of a liquid crystal module halfway through the manufacture, in which a flexible base material is not yet bent.

Note that, for ease of explanation, members having the same functions as those shown in the drawings pertaining to the First through Third Embodiments above will be given the same reference numerals, and explanation thereof will be omitted here. Further, various features described in the First through Third Embodiments will be considered applicable in combination in the present embodiment.

A liquid crystal module 50 which is still another embodiment of a display device according to the present invention, as shown in FIGS. 12(a), 12(b), 13(a) and 13(b), has a liquid crystal display panel 11A as with a liquid crystal module 30 of FIG. 7. The liquid crystal display panel 11A is provided with an upper glass substrate 1 and a lower glass substrate 32 which is longer than the upper glass substrate 1 and given a chamfered portion 32b at a corner. On the glass substrate 32, an extension of panel electrode terminals 3 is left uncovered.

Further, the liquid crystal module 50 has a semiconductor apparatus which functions as a liquid crystal driver for driving the liquid crystal display panel 11A. The semiconductor apparatus is made up of a flexible wire board 20 and an IC chip (a semiconductor device) 9. The flexible wire board 20 includes a base material 21 and a Cu foil pattern 22 which is formed as a wire pattern on a surface of the base material 21. The IC chip 9 is mounted on the flexible wire board 20 on one side closer to a plastic chassis 70, thereby functioning as a liquid crystal driver IC (IC: Integrated Circuit). Further, the semiconductor apparatus is connected to a printed wire board (PWB) 8 for inputting a signal to the semiconductor apparatus. Note that, the flexible wire board 20 shown in FIGS. 12(a) and 12(b) has the same arrangement as that of the flexible wire board 20 of FIG. 1, except for a point that the solder resist 23 is removed from portions of the flexible wire board 20 which respectively correspond to the IC chip 9 and the printed wire board 8, and the Cu foil pattern 22 is therefore exposed at these portions.

The border of two portions of the flexible wire board 20, one of which having the solder resist 23 and the other exposing the Cu foil pattern 22, is located apart from the panel electrode terminals 3 and a corner 32a which are stacked on the chamfered portion 32b of the liquid crystal display panel 11A. In other words, an end ("tip", hereinafter) 23a of the solder resist 23, which is closer to the pattern terminals 22a, is extended to cover the chamfered portion 32b of the liquid crystal display panel 11A when the flexible wire board 20 is connected to the liquid crystal display panel 11A.

An anisotropic conductive adhesive 52 is applied not only to the panel electrode terminals 3 but also to the chamfered portion 32b. This causes the flexible wire board 20 to adhere to the whole surfaces of the panel electrode terminals 3 and the chamfered portion 32b (including the corner 32a) of the lower glass substrate 32. In addition, in the flexible wire board 20, a peripheral portion of the tip 23a of the solder resist 23, i.e., the periphery of the border of the portion having the solder resist 23 and the portion exposing the Cu foil pattern 22 is bonded onto the chamfered portion 32b. Furthermore, the anisotropic conductive adhesive 52 is provided so that it protrudes from the chamfered portion 32b of the lower glass substrate 32. Note that, the anisotropic conductive adhesive 52 has the same composition as that of an anisotropic conductive adhesive 12, except for its position. Note that, used here is a film-type anisotropic conductive adhesive 52, which is affixed onto a surface of the lower glass substrate 32.

A generally taken method of bonding the pattern terminals 22a of the flexible wire board 20 and the panel electrode terminals 3 of the liquid crystal display panel 11A by using the anisotropic conductive adhesive 52 is as follows: first, a not-yet-cured anisotropic conductive adhesive 52 (film-type) is provided on the panel electrode terminals 3 and the chamfered portion 32b of the lower glass substrate 32. Next, the flexible wire board 20 is heated while being pressed onto the lower glass substrate 32 by using a flat part of a not-shown bonding tool from the side of a surface of the liquid crystal display panel 11A (the side of the upper glass substrate 1), thereby curing the anisotropic conductive adhesive 52.

With this positioning, a not-bonded portion of the flexible wire board 20 is bent to a rear side of the liquid crystal display panel 11A (i.e., the rear side of a side having the panel electrode terminals 3) via the plastic chassis 70 in between. Furthermore, an end of the Cu foil pattern 22, the other end of which is closer to the pattern terminals 22a, is connected to the printed wire board 8.

As described, in the liquid crystal module 50 of the present embodiment, the solder resist 23 is extended into the chamfered portion 32b of the liquid crystal display panel 11A when the flexible wire board 20 is connected to the liquid crystal display panel 11A. This causes the Cu foil pattern 22 of the flexible wire board 20 to be solely covered, thereby preventing a break in wire of the Cu foil pattern 22, which may be caused by the corner 32a of the liquid crystal display panel 11A in contact with the Cu foil pattern 22.

Further, in the liquid crystal module 50 of the present embodiment, the border (i.e., the tip portion 23a of the solder resist 23) of two portions of the flexible wire board 20, one of which having the solder resist 23 and the other exposing the Cu foil pattern 22, which border receives an intensive bending stress, is fixed onto the chamfered portion 32b of the liquid crystal display panel 11A by using the anisotropic conductive adhesive 52. Accordingly, that bending stress is focused on the border of the two portions of the flexible wire board 20, one of which having the solder resist 23 and the other exposing the Cu foil pattern 22, is prevented when the flexible wire board 20 is bent, thereby almost evenly adding bending stress to a bent portion of the flexible wire board 20. As a result, it is possible to prevent a break in wire of the Cu foil pattern 22, which may be caused by an intense bending stress focused on the border of the portions of the flexible wire board 20 respectively having the solder resist 23 and exposing the Cu foil pattern 22 particularly when the flexible wire board 20 is bent to a small radius of curvature.

Further, in the liquid crystal module 50 of the present embodiment, the anisotropic conductive adhesive 52 is provided so as to protrude from the corner 32a of the lower glass substrate 32. Therefore, even when the corner 32a of the liquid crystal display panel 11A is chipped, the chipped portion is covered with the anisotropic conductive adhesive 52, thereby surely preventing a break in wire of the Cu foil pattern 22, which may be caused by the chipped portion in contact with the flexible wire board 20.

Further, in the liquid crystal module 50 of the present embodiment, the flexible wire board 20 is bent so that it covers the chamfered portion 32b of the liquid crystal display panel 11A. This allows the flexible wire board 20 to be bent to a small radius of curvature, thereby downsizing a frame of a display module. Furthermore, by thus providing the anisotropic conductive adhesive 52 so as to protrude from the corner 32a of the lower glass substrate 32, as shown in FIGS. 13(a) and 13(b), a bank (a largely protruded portion) 52a of the anisotropic conductive adhesive 52 appears in the vicinity of the corner 32a of the lower glass substrate 32 due to a difference in heat pressure at the time of thermocompression bonding. With this bank 52a are bonded the bent portion of the flexible wire board 20 outside the lower glass substrate 32 and a side 32c of the lower glass substrate 32, thereby preventing the flexible wire board 20 from peeling off the liquid crystal display panel 11A in a lateral direction.

Further, at the time of compression bonding of the pattern terminals 22a of the flexible wire board 20 and the panel electrode terminals 3 of the liquid crystal display panel 11A, it is common that the flexible wire board 20 is pressed against an upper surface (i.e., a plane excluding the chamfered portion 32b) of the lower glass substrate 32 in a direction normal to the plane by using the flat part of the bonding tool.

Given this, a level gap, if any, in the portion of the flexible wire board 20 pressed against the upper surface of the lower glass substrate 32 prevents an even application of pressure, which often causes displacement of the pattern terminals 22a of the flexible wire board 20 on the panel electrode terminals 3 of the liquid crystal display panel 11A. Once the displacement of the pattern terminals 22a of the flexible wire board 20 on the panel electrode terminals 3 of the liquid crystal display panel 11A occurs in a horizontal direction (i.e., a direction of the width of the flexible wire board 20), an effective area of the anisotropic conductive adhesive 52 (i.e., the area of a portion between the pattern terminals 22a and the panel electrode terminals 3) that connects the pattern terminals 22a and the panel electrode terminals 3 becomes small, thereby causing a rise in electrical resistance, or poor connection in a worst case, between the pattern terminals 22a and the panel electrode terminals 3.

On the other hand, the liquid crystal module 50 of the present embodiment has an arrangement in which the border of the portions of the flexible wire board 20 respectively having the solder resist 23 and exposing the Cu foil pattern 22 comes above the chamfered portion 32b of the lower glass substrate 32, and the portion of the flexible wire board 20 pressed against the upper surface of the lower glass substrate 32 has an even thickness. Therefore, a displacement of the pattern terminals 22a of the flexible wire board 20 on the panel electrode terminals 3 of the liquid crystal display panel 11A hardly occurs, thereby more surely preventing the aforesaid problem of the rise in electrical resistance and/or poor connection.

[Fifth Embodiment]

Figure 14:
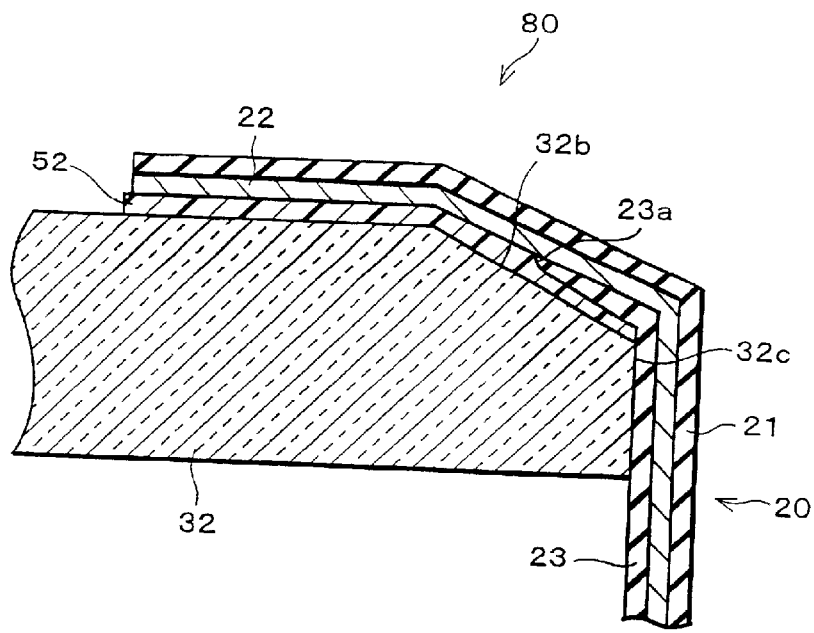
FIG. 14 is a cross-sectional view of a liquid crystal module according to another embodiment of the present invention.
Figure 15:
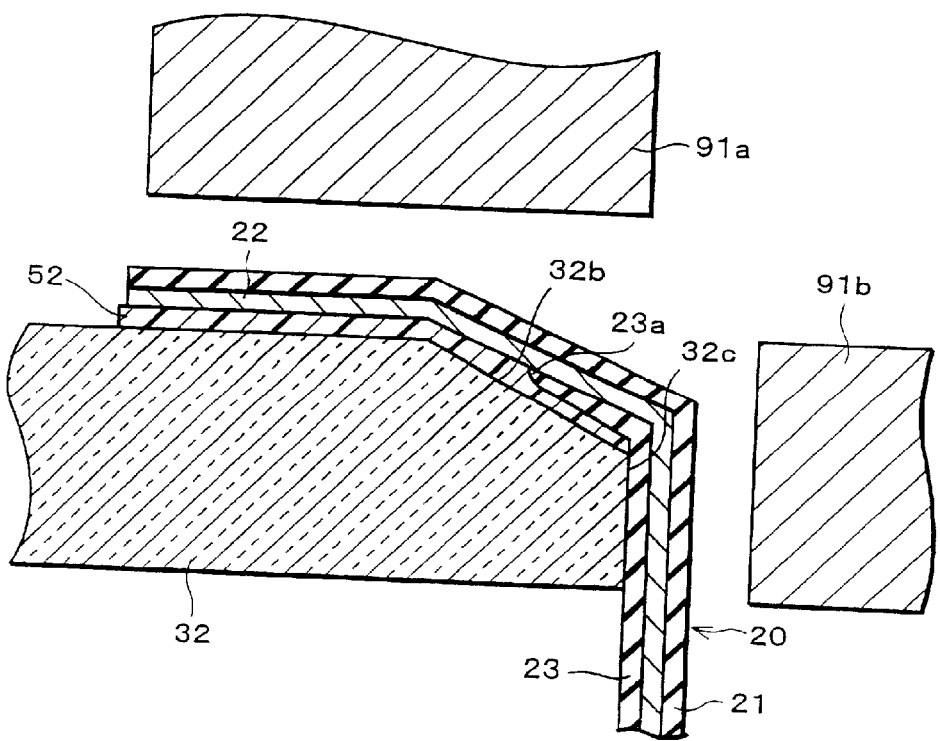
FIG. 15 is an explanatory view showing manufacturing steps for the liquid crystal module of FIG. 14.

The following will describe yet another embodiment of the present invention with reference to FIGS. 14 and 15. Note that, for ease of explanation, members having the same functions as those shown in the drawings pertaining to the First through Fourth Embodiments above will be given the same reference numerals, and explanation thereof will be omitted here. Further, various features described in the First through Fourth Embodiments will be considered applicable in combination in the present embodiment.

A liquid crystal module 80, as with a liquid crystal module 50, has an arrangement in which a liquid crystal display panel 11A and a flexible wire board 20 are bonded by using an anisotropic conductive adhesive 52 so that panel electrode terminals 3 of a lower glass substrate 2 of the liquid crystal display panel 11A are electrically connected with pattern terminals 22a of the flexible wire board 20, and a tip portion 23a of a solder resist 23 is fixed onto a chamfered portion 32b.

The following will indicate effects attained by the liquid crystal module 80 of the present embodiment in addition to effects attained by the liquid crystal module 50. First of all, since the flexible wire board 20 is completely fixed in the vicinity of a corner 32a of the liquid crystal display panel 11A, a break in wire of a Cu foil pattern 22, which may be caused by an intensive bending stress added to the border of portions of the flexible wire board 20 respectively having the solder resist 23 and exposing the Cu foil pattern 22, can more surely be prevented.

Second, in the liquid crystal module 80 of the present embodiment, a side 32c of the lower glass substrate 32 and the flexible wire board 20 are tightly fixed to each other without a clearance therebetween, thereby enabling the flexible wire board 20 to be bent to a small radius of curvature. Consequently, a frame of a display module can be downsized.

The following will describe a method of manufacturing the liquid crystal module 80 of the present embodiment.

As shown in FIG. 15, the anisotropic conductive adhesive 52 is applied in advance to the lower glass substrate 32 of the liquid crystal display panel 11A so that it covers the side 32c of the lower glass substrate 32. Then, using a bonding tool 91a made of SUS (stainless steel) as a means to perform thermocompression bonding with respect to the flexible wire board 20, the pattern terminals 22a of the flexible wire board 20 and the panel electrode terminals 3 of the liquid crystal display panel 11A are bonded using the anisotropic conductive adhesive 52. Thereafter, using a bonding tool 91b, the side 32c of the lower glass substrate 32 and the flexible wire board 20 are fixed to each other with the anisotropic conductive adhesive 52 in the same manner. Here, the bonding tools 91a and 91b have been heated to 300° C.

More preferably, the side 32c of the lower glass substrate 32 and the flexible wire board 20 are bonded while the flexible wire board 20 is pulled toward the rear side of the liquid crystal display panel 11A.

By a mounting method like this, the flexible wire board 20 and the liquid crystal display panel 11A can be connected to each other without creating a clearance between the flexible wire board 20 and the chamfered portion 32b. The reason the connection can be so made will be explained below. First, when the pattern terminals 22a and the panel electrode terminals 3 are bonded using the anisotropic conductive adhesive 52, the anisotropic conductive adhesive 52 on the chamfered portion 32b is partially cured in the vicinity of the panel electrode terminals 3 by waste heat spreading around the bonding tool 91a. Second, when the side 32c of the lower glass substrate 32 and the flexible wire board 20 are bonded using the anisotropic conductive adhesive 52, the anisotropic conductive adhesive 52 on the chamfered portion 32b is partially cured in the vicinity of the side 32c by waste heat spreading around the bonding tool 91b.

This prevents bending stress from being focused on tip 23a of the solder resist 23 of the flexible wire board 20, while mounting the flexible wire board 20 onto the liquid crystal display panel 11A by bending it to a minimum radius of curvature.

As discussed in each embodiment above, a display module according to the present invention has an arrangement in which an insulating protective layer of a flexible wire board is extended inside a display panel while having the flexible wire board connected to the display panel. Consequently, even when the flexible wire board is used in a bent state, a wire pattern does not directly contact a corner of the display panel, thereby preventing a break in wire of the wire pattern.

As a result, it is possible to provide a highly reliable display module having an arrangement in which, in a flexible wire board including an insulating protective film to cover a wire pattern and being used in a bent state, a short circuit in the wire pattern is surely prevented, while conveniently suppressing a break in wire of the wire pattern when the flexible wire board is bent.

Further, as discussed, a display module of the present invention may have an arrangement in which, in the display module having the foregoing arrangement, the flexible wire board is bonded onto a surface of the display panel by using an anisotropic conductive adhesive at a periphery of an edge of the insulating protective layer closer to terminals.

With this arrangement, the periphery of a tip (the edge closer to the terminals) of the insulating protective layer, on which bending stress tends to be focused when the flexible wire board is bent, is bonded onto the surface (or more preferably, a plane or a curved surface having a large radius of curvature) by using the anisotropic conductive adhesive. This prevents an addition of bending stress to the tip of the insulating protective layer of the flexible wire board, thereby almost evenly adding bending stress to a bent portion apart from the tip. Consequently, it is possible to prevent an intense bending stress from being focused on a specific position of the wire pattern (i.e., the tip of the insulating protective layer), thereby preventing a break in wire of the wire pattern.

Further, as discussed, a display module according to the present invention may have an arrangement in which, in the display module having the foregoing arrangement, the anisotropic conductive adhesive is provided so as to protrude from the display panel.

With this arrangement, the insulating protective layer is extended to the terminals of the wire pattern of the flexible wire board. Therefore, the anisotropic conductive adhesive is provided as an upper layer of the insulating protective layer. Moreover, the anisotropic conductive adhesive is provided so as to protrude from the display panel. Therefore, when the flexible wire board is used in a bent state, the insulating protective layer is provided on an inner side of the bent flexible wire board, and the anisotropic conductive adhesive is provided over the insulating protective layer. Consequently, when the flexible wire board is thus used in the bent state, it is the anisotropic conductive adhesive that contacts a corner of the display panel. Therefore, the wire pattern is prevented from directly contacting the corner of the display panel, and a portion of the anisotropic conductive adhesive thus contacting the corner of the display panel is a double layer of the anisotropic conductive adhesive and the insulating protective layer, thereby more surely preventing a break in wire of the wire pattern. Particularly, in the case where the corner of the display panel is chipped, a break in wire of the wire pattern is likely to be caused by the chipped portion in contact with the flexible wire pattern. However, with the foregoing arrangement, the chipped portion like this can be covered with the anisotropic conductive adhesive, thereby preventing the break in wire of the wire pattern caused by the chipped portion in contact with the flexible wire pattern.

Further, thus providing the anisotropic conductive adhesive so as to protrude from the display panel enables the display panel and the flexible wire board to be bonded to each other at an edge of the display panel, thereby making it difficult that the flexible wire board peels off the display panel. More specifically, with the foregoing arrangement, a portion of the anisotropic conductive adhesive protruding from the display panel becomes a bank of the anisotropic conductive adhesive in the vicinity of the corner of the display panel. With this bank of the anisotropic conductive adhesive are bonded a portion of the flexible wire board outside the display panel and a side of the display panel, thereby preventing the flexible wire board from peeling off the display panel in a lateral direction.

Note that, in the Specification of the present application, a description "(Z) protrudes from a display panel" means the continuous presence of Z on both the inside and outside of the display panel that are divided by a side edge of the display panel (the side which an insulating protective layer crosses over) as being the border.

Further, as discussed, a display module of the present invention may have an arrangement in which, in the display module having the foregoing arrangement, the base material of the flexible wire board has a thickness of not more than 40 $\mu$m, and the insulating protective layer has a thickness of not more than 40 $\mu$m, and the insulating protective layer is bonded onto the base material having the wire pattern by thermocompression bonding.

With this arrangement, the base material of the flexible wire board has a thickness of not more than 40 μm. Therefore, a base material thickness is small compared to a conventional flexible wire board subject to TCP mounting in which a base material thickness is 75 μm. Furthermore, the insulating protective layer, too, has a thickness of not more than 40 μm and is bonded onto the base material having the wire pattern by thermocompression bonding. Namely, an adhesive is not used, and the flexible wire board in its entirety is thin. Further, the insulating protective layer is generally richer in flexibility than the base material, thereby easily bending the flexible wire board.

Further, as discussed, a display module of the present invention may have an arrangement in which, in the display module having the foregoing arrangement, a chamfered portion is formed at a corner of the display panel facing an inner side of the flexible wire board in a bent state, and the insulating protective layer is extended inside the display panel beyond the chamfered portion.

With this arrangement, the chamfered portion is formed at the corner of the display panel facing the inner side of the flexible wire board in the bent state. This widens a contact portion of the flexible wire board which contacts the display panel, thereby preventing bending force from locally acting on the wire pattern when the flexible wire board is bent. Further, with this arrangement, the insulating protective layer is extended inside the display panel beyond the chamfered portion, thereby causing either the insulating protective layer or the anisotropic conductive adhesive to contact the wide chamfered portion.

As a result, in the flexible wire board, a short circuit in the wire pattern is surely prevented, while conveniently and surely suppressing a break in wire of the wire pattern when bent, thereby providing a highly reliable display module.

Further, as discussed, a display module of the present invention may have an arrangement in which, in the display module having the foregoing arrangement, a chamfered portion is given at a corner of the display panel facing an inner side of the flexible wire board in a bent state, and the insulating protective layer is extended so as to come inside the chamfered portion of the display panel when the flexible wire board is connected to the display panel.

With this arrangement, the wire pattern is not exposed at least at a portion of the flexible wire board which faces the corner of the display panel, thereby surely preventing a break in wire due to the corner of the display panel in contact with the wire pattern.

With this arrangement, further, the chamfered portion is provided at the corner of the display panel. This enables the flexible wire board to be bent in a direction in which the flexible wire board curves along the form of the display panel (i.e., a direction in which the flexible wire board outside the display panel approaches a side of the display panel). This enables the flexible wire board to be bent to a small radius of curvature in the direction in which the flexible wire board curves along the form of the display panel. As a result, a frame of the display module can be downsized (i.e., a plane of the display panel outside is downsized), thereby providing a display module having a small plane size (i.e., the size measured in a direction parallel to the display panel).

Further, as discussed, a display module of the present invention may have an arrangement in which, in the display module having the foregoing arrangement, the flexible wire board is bonded onto the chamfered portion of the display panel by using the anisotropic conductive adhesive.

With this arrangement, the periphery of a tip of the insulating protective layer of the flexible wire board is fixed onto the chamfered portion of the display panel by using the anisotropic conductive adhesive. This prevents bending stress from being added to the tip of the insulating protective layer of the flexible wire board, and bending stress is almost evenly added to a bent portion of the flexible wire board apart from the tip, thus preventing an intense bending stress from being focused on a specific portion of the wire pattern (the tip portion of the insulating protective layer), thereby preventing a break in wire of the wire pattern.

Further, as discussed, a display module of the present invention may have an arrangement in which, in the display module having the foregoing arrangement, the flexible wire board is bonded also to a side of the display panel by using the anisotropic conductive adhesive.

With this arrangement, since a portion of the flexible wire board near the tip of the insulating protective layer, which tends to receive an intensive bending stress, is fixed to the side of the display panel, bending stress is more surely prevented from being added in the vicinity of an end of the insulating protective layer, thereby more surely preventing a break in wire of the wire pattern due to an intensive bending stress at the tip of the insulating protective layer of the flexible wire board.

With this arrangement, further, since the flexible wire board is bonded to the side of the display panel by using the anisotropic conductive layer, a portion of the flexible wire board which faces the side of the display panel is fixed to the side of the display panel without a clearance therebetween. This enables the flexible wire board to be bent to a minimum radius of curvature, thereby downsizing a frame of the display module.

Further, as discussed, a display module of the present invention may have an arrangement in which, in the display module having the foregoing arrangement, the insulating protective layer of the flexible wire board is extended inside the display panel only through both sides in a direction of a width of the flexible wire board.

More specifically, a break in wire of the wire pattern due to bending the flexible wire board occurs in most cases on the both sides in the direction of the width of the flexible wire board.

Given this, in the foregoing arrangement, the insulating protective layer of the flexible wire board is extended inside the display panel only through the both sides in the direction of the width of the flexible wire board, thereby efficiently suppressing a break in wire of the wire pattern when bent.

A flexible wire board according to the present invention, which has a base material, a wire pattern and an insulating protective layer for protecting the wire pattern on the base material, terminals of the wire pattern being connected to external connection terminals of the display panel by using an anisotropic conductive adhesive, has an arrangement in which the insulating protective layer is extended toward the terminals of the wire pattern so that it comes inside the display panel while having the flexible wire board connected to the display panel.

With this arrangement, the insulating protective layer of the flexible wire board is extended toward the terminals of the wire pattern so that it comes inside the display panel while having the flexible wire board connected to the display panel. Therefore, when the flexible wire board is used in a bent state, the insulating protective layer is provided on an inner side of the flexible wire board in the bent state. This prevents the wire pattern from directly contacting a corner of the display panel, thereby preventing a break in wire of the wire pattern.

As a result, in a flexible wire board which includes an insulating protective film to cover a wire pattern and is used in a bent state, a short circuit in the wire pattern is surely prevented while conveniently suppressing a break in wire of the wire pattern when bent, thereby providing a highly reliable flexible wire board.

A flexible wire board connecting method according to the present invention, in which a flexible wire board includes a base material, and a wire pattern and an insulating protective layer for protecting the wire pattern on the base material, and terminals of the wire pattern are connected to external connection terminals outside a display panel by using an anisotropic conductive adhesive, the method has an arrangement in which the insulating protective layer is extended inside the display panel while having the flexible wire board connected to the display panel.

With this method, when the terminals of the flexible wire board having the wire pattern and the insulating protective layer for protecting the wire pattern on the base material are connected to the external connection terminals outside the display panel by using the anisotropic conductive adhesive, the insulating protective layer of the flexible wire board is extended inside the display panel while having the flexible wire board connected to the display panel.

Consequently, in the case where the flexible wire board is used in a bent state, the insulating protective layer is provided on an inner side of the flexible wire board in the bent state. This prevents the wire pattern from directly contacting a corner of the display panel, thereby preventing a break in wire of the wire pattern.

As a result, in a flexible wire board which includes an insulating protective film to cover a wire pattern and is used in a bent state, a short circuit in the wire pattern is surely prevented while conveniently suppressing a break in wire of the wire pattern when bent, thereby providing a highly reliable flexible wire board connecting method.

Further, a flexible wire board connecting method according to the present invention may have an arrangement in which, in the foregoing flexible wire board connecting method, the anisotropic conductive adhesive is extended to protrude from the display panel.

With this method, since the insulating protective layer is extended to the terminals of the wire pattern of the flexible wire board, the anisotropic conductive adhesive is provided as an upper layer of the insulating protective layer. Furthermore, in the present invention, the anisotropic conductive adhesive is extended to protrude from the display panel.

Thus, when the flexible wire board is used in a bent state, the insulating protective layer is provided on an inner side of the flexible wire board in the bent state, and the anisotropic conductive adhesive is provided as the upper layer of the insulating protective adhesive. Therefore, when the flexible wire board is used in the bent state, it is the anisotropic conductive adhesive that contacts a corner of the display panel. Accordingly, the wire pattern is prevented from directly contacting the corner of the display panel, and a portion of the anisotropic conductive adhesive thus contacting the corner of the display panel is a double layer of the anisotropic conductive adhesive and the insulating protective layer, thereby more surely preventing a break in wire of the wire pattern.

Further, extending the anisotropic conductive adhesive so that it protrudes from the display panel causes the display panel and the flexible wire board to be bonded at an edge of the display panel, thereby making it more difficult that the flexible wire board peels off the display panel.

Further, a flexible wire board connecting method according to the present invention, in the foregoing flexible wire board connecting method, may include the step (A) of bonding a side of the display panel and the flexible wire board via the anisotropic conductive adhesive in between by thermocompression bonding.

With this method, a break in wire in the wire pattern due to an intensive bending stress at a tip of the insulating protective layer of the flexible wire board can be prevented, while mounting the flexible wire board on the display panel by bending the flexible wire board to a minimum radius of curvature.

Further, a flexible wire board connecting method according to the present invention, in the foregoing flexible wire board connecting method, may have an arrangement in which the foregoing step (A) is taken following the step (B) of bonding external connection terminals of the display panel and the terminals of the flexible wire board via the anisotropic conductive adhesive in between by thermocompression bonding.

With this method, since the method includes the two steps (B) and (A), the flexible wire board can be bonded onto the chamfered portion without a clearance therebetween by using waste heat resulted from the application of heat in the both steps.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A display module, comprising:
   a display panel provided with external connection terminals; and
   a flexible wire board having a wire pattern on a base material, terminals of the wire pattern of the flexible wire board and the external connection terminals of the display panel being bonded using an anisotropic conductive adhesive, the flexible wire board having an insulating protective layer for protecting the wire pattern,
   wherein the anisotropic conductive adhesive is extended to protrude from the display panel, and
   wherein the insulating protective layer of the flexible wire board is extended inside the display panel only through both sides in a width direction of the flexible wire board while having the flexible wire board connected to the display panel.

2. The display module set forth in claim 1, wherein:
   the flexible wire board is bonded onto a surface of the display panel at a periphery of an edge of the insulating protective layer closer to the terminals by using the anisotropic conductive adhesive.

3. The display module set forth in claim 1, wherein:
   the base material of the flexible wire board has a thickness of not more than 40 $\mu$m, and the insulating protective layer has a thickness of not more than 40 $\mu$m, and the insulating protective layer is bonded onto the base material including the wire pattern by thermocompression bonding.

4. The display module set forth in claim 1, wherein:
   a corner of the display panel, which faces an inner side of a bent portion of the flexible wire board in a bent state, is formed into a chamfered portion, and the insulating protective layer of the flexible wire board is extended inside the display panel beyond the chamfered portion.

5. The display module set forth in claim 1, wherein:
a corner of the display panel, which faces an inner side of a bent portion of the flexible wire board in a bent state, is formed into a chamfered portion, and the insulating protective layer of the flexible wire board is extended inside the chamfered portion while having the flexible wire board connected to the display panel.

6. The display module set forth in claim 5, wherein:
the flexible wire board is also bonded onto the chamfered portion of the display panel by using the anisotropic conductive adhesive.

7. The display module set forth in claim 5, wherein:
the flexible wire board is also bonded onto a side of the display panel by using the anisotropic conductive adhesive.

8. The display module set forth in claim 5, wherein:
the flexible wire board is bonded onto the chamfered portion and a side of the display panel by using the anisotropic conductive adhesive.

9. A flexible wire board, comprising:
a base material;
a wire pattern; and
an insulating protective layer for protecting the wire pattern on the base material, terminals of the wire pattern being connected to external connection terminals of a display panel by using an anisotropic conductive adhesive,
wherein the anisotropic conductive adhesive is extended to protrude from the display panel, and
wherein the insulating protective layer is extended toward the terminals of the wire pattern so that it extends inside the display panel only through both sides in a width direction of the flexible wire board while having the flexible wire board connected to the display panel.

10. A method for connecting a flexible wire board, comprising:
providing a flexible wire board including a base material, a wire pattern and an insulating protective layer for protecting the wire pattern on the base material;
connecting terminals of the wire pattern to external connection terminals outside a display panel by using an anisotropic conductive adhesive,
wherein the anisotropic conductive adhesive is extended to protrude from the display panel, and
wherein the insulating protective layer is extended inside the display panel only through both sides in a width direction of the flexible wire board while having the flexible wire board connected to the display panel.

11. The flexible wire board connecting method set forth in claim 10, including the step of:
bonding a side of the display panel and the flexible wire board via the anisotropic conductive adhesive in between by thermocompression bonding.

12. The flexible wire board connecting method as set forth in claim 11, wherein:
said step is taken following the step of bonding external connection terminals of the display panel and the terminals of the flexible wire board via the anisotropic conductive adhesive in between by thermocompression bonding.

13. The flexible wire board connecting method set forth in claim 10, wherein:
the anisotropic conductive adhesive is extended to protrude from the display panel, and
the method including the step of:
bonding a side of the display panel and the flexible wire board via the anisotropic conductive adhesive in between by thermocompression bonding.

14. A display module, comprising:
a display panel provided with external connection terminals and a flexible wire board having a wire pattern on a base material, terminals of the wire pattern of the flexible wire board and the external connection terminals of the display panel being bonded using an anisotropic conductive adhesive, the flexible wire board having an insulating protective layer for protecting the wire pattern,
wherein:
the anisotropic conductive adhesive is extended to protrude from the display panel;
the flexible wire board is a COF; and
the insulating protective layer of the flexible wire board is extended inside the display panel while having the flexible wire board connected to the display panel.

15. A display module which includes a display provided with external connection terminals and a flexible wire board having a wire pattern on a base material, terminals of the wire pattern of the flexible wire board and the external connection terminals of the display panel being bonded using an anisotropic conductive adhesive, the flexible wire board having an insulating protective layer for protecting the wire pattern,
wherein:
the anisotropic conductive adhesive is extended to protrude from the display panel, and
at least a part of an end portion of the insulating protective layer of the flexible wire board is extended inside the display panel while having the flexible wire board connected to the display panel, the end portion being that of an external connection terminal side.

* * * * *